(12) United States Patent
Ly et al.

(10) Patent No.: US 7,243,322 B1
(45) Date of Patent: Jul. 10, 2007

(54) METASTABILITY INJECTOR FOR A CIRCUIT DESCRIPTION

(76) Inventors: Tai An Ly, 1620 Campbell Ave., San Jose, CA (US) 95125; Ka Kei Kwok, 928 Cameron Cir., Milpitas, CA (US) 95035; Vijaya Vardhan Gupta, 114 Birch Ridge Cir., San Jose, CA (US) 95123; Ross Andrew Ander, 933 Highlands Cir., Los Altos, CA (US) 94024; Ping Fai Yeung, 1101 Brooks Range Landing, San Jose, CA (US) 95131; Neil Patrick Hand, 977 Oak La., Menlo Park, CA (US) 94025; Lawrence Curtis Widdoes, Jr., 3814 Brigadoon Way, San Jose, CA (US) 95121

( * ) Notice: Subject to any disclaimer, the term of this patent is extended or adjusted under 35 U.S.C. 154(b) by 371 days.

(21) Appl. No.: 10/859,055

(22) Filed: Jun. 1, 2004

(51) Int. Cl.
*G06F 17/50* (2006.01)
*G06F 9/45* (2006.01)
(52) U.S. Cl. .............................................. 716/5; 716/6
(58) Field of Classification Search .................... 716/5, 716/6
See application file for complete search history.

(56) References Cited

U.S. PATENT DOCUMENTS

| | | | |
|---|---|---|---|
| 4,575,644 A * | 3/1986 | Leslie | 327/198 |
| 5,465,216 A | 11/1995 | Rotem et al. | |
| 6,175,946 B1 | 1/2001 | Ly et al. | |
| 6,192,505 B1 | 2/2001 | Beer et al. | |
| 6,408,265 B1 * | 6/2002 | Schultz et al. | 703/22 |
| 6,580,773 B1 * | 6/2003 | Corvasce | 375/355 |
| 6,609,229 B1 | 8/2003 | Ly et al. | |
| 7,089,518 B2 * | 8/2006 | Bair et al. | 716/6 |
| 2005/0069068 A1 * | 3/2005 | Gundurao et al. | 375/354 |
| 2005/0097484 A1 * | 5/2005 | Sarwary et al. | 716/6 |
| 2005/0273735 A1 * | 12/2005 | Dargelas | 716/4 |

OTHER PUBLICATIONS

Robert K. Brayton et al., "VIS: A System for Verification and Synthesis"; believed to be prior to Jun. 01, 2004, pp. 1-4.

(Continued)

*Primary Examiner*—Stacy A. Whitmore
*Assistant Examiner*—Magid Y. Dimyan
(74) *Attorney, Agent, or Firm*—Brian N. Young; Trellis Intellectual Property Law Group, PC

(57) ABSTRACT

During verification of a description of a circuit containing a pre-determined assertion, in order to detect incorrect behavior of the circuit that may be caused by metastability occurring in signals that cross clock domains ("CDC" signals) in the circuit, the description of the circuit is automatically transformed by addition of circuitry to inject the effects of metastability into the CDC signals. The transformed description containing the circuitry to inject metastability is verified in the normal manner. Certain embodiments analyze the transformed description using a model checking method to determine a stimulus sequence that will cause the pre-determined assertion to be violated. The transformed circuit is then simulated in some embodiments, using the stimulus sequence from model checking, and an incorrect behavior of the circuit due to metastability is displayed, for diagnosis by the circuit designer. The circuit designer may revise the circuit description and iterate as noted above.

24 Claims, 24 Drawing Sheets

OTHER PUBLICATIONS

Chris Ka-kei Kwok et al., "Using Assertion-Based Verification to Verify Clock Domain Crossing Signals", Design & Verification Conference (DVCon) Technical Paper, Feb. 2003 © 2003 DVCon, pp. 1-9.

Tim Behne, "FPGA Clock Schemes", Embedded Systems Programming, Feb. 10, 2003 (13:33 PM), URL: http://www.embedded.com/showArticle.jhtml?articleID=9901007, pp. 1-6.

Michael Crews et al., "Practical design for transferring signals between clock domains", www.edn.com, Feb. 20, 2003, pp. 65, 66, 68, and 71.

Jens Rennert et al., "Clock domain modeling is essential in high density SoC design", EETIMES, Jun. 6, 2003 (1:10 PM EDT); URL: http://www,eetimes,com/article/showArticle.jhtml?articleID=12804185, pp. 1-4.

Edmund Clarke et al., "Bounded Model Checking Using Satisfiability Solving", published in Formal Methods in System Design, vol. 19 issue 1, Jul. 2001, by Kluwer Academic Publishers, pp. 1-20.

Christoph Kern et al., "Formal Verification in Hardware Design: A Survey," in ACM Trans. On Design Automation of Electronic Systems, vol. 4, pp. 123-193, Apr. 1999.

Robert K. Brayton et al.; VIS: A System for Verification and Synthesis; Proceedings on Computer-Aided Verification; Jul. 1996; pp. 1-4.

Chris Ka-Kei Kwok et al.; "Using Assertion-Based Verification to Verify Clock Domain Crossing Signals"; Design & Verification Conference (DVCon) Technical Paper; Feb. 2003; DVCon; pp. 1-9.

Tim Behne; "FPGA Clock Schemes"; Embedded Systems Programming; Feb. 10, 2003; URL http://www.embedded.com/shared/printableArticle.jhtml;jsesessionid...; pp. 1-6.

Michael Crews et al.; "Practical Design for Transferring Signals Between Clock Domains"; www.edn.com; Feb. 20, 2003; pp. 65, 66, 68, 71.

Jens Rennert et al.; "Clock Domain Modeling is Essential in High Desity SOC Design"; EETIMES; Jun. 6, 2003; URL: http://eetimes.com/article/printableArticle.jhtml;jsessionid....; pp. 1-4.

Edmund Clarke et al.; "Bounded Model Checking Using Satisfiability Solving"; published in Formal Methods in System Design; vol. 19, iss. 1; Jul. 2001; Kluwer Academic Publishers; pp. 1-20.

Christoph Keran et al.; "Formal Verification in Hardware Design: A Survey"; in ACM Trans. On Design Automation of Electronic Systems; vol. 4; Apr. 1999; pp. 1-61.

William J. Dally et al.; "Digital Systems Enineering"; Cambridge University Press; 1998; pp. 462-513.

Edmund M. Clarke, Jr. et al.; "Model Checking"; The MIT Press, Cambridge Mass.; 1999; pp. 35-49.

"VIS: A system for Verification and Synthesis"; The VIS Group, In the Proceedings of the 8th International Conference on Computer Aided Verification, pp. 428-432; Springer Lecture Notes in Computer Science, #1102; Edited by R. Alur and T. Henzinger, New Brunswick, NJ, Jul. 1996; pp. 1-2.

J.R. Burch' "Symbolic Model Checking: 1020 States and Beyond"; Information and Computation, vol. 98 No. 2; Jun. 1992; pp. 428-439.

Yatin Hoskote et al.' "Coverage Estimation for Symbolic Model Checking"; ACM Inc. 1999; pp. 1-6.

Jerry R. Burch et al.; "Automatic Verification of Pipeling Microprocessor Control"; Conference on Computer-Aided Verification Jun. 1994; pp. 1-17.

E.M. Clarke et al.; "Automatic Verification of Finite-State Concurrent Systems Using Temporal Logic Specifications"; ACM Transactions on Programming Languages and Systems; vol. 8, No. 2; Apr. 1986; pp. 224-263.

David L. Dill et al.; "Protocol Verification as a Hardware Design Aid"; Stanford University; 1992; pp. 1-4.

Donald E. Thomas et al.; "The Verilog Hardware Discription Language, Fifth Edition"; Verilog of Cadence Design Systems Inc.; 2002; pp. 195-210.

K.L. McMillan; "Symbolic Model Checking—and Approach to the State Explosion Problem"; Carnegie Mellon University 1992; pp. 1-212.

\* cited by examiner

METASTABILITY INJECTOR FOR A CIRCUIT DESCRIPTION

BACKGROUND

FIG. 1A shows a prior art circuit 100 containing two portions 101 and 102 and a path 104 that carries a signal from portion 101 to portion 102. Path 104 may pass through any amount of combinational logic 199 (formed of logic elements but no storage elements). Registers in one portion 102 are clocked by a clock signal on a path 105 whereas registers in the other portion 101 are clocked by another clock signal on a different path 106. Note that the two clock signals on the two paths 105 and 106 are different from one another, which makes the two portions 101 and 102 into two different clock domains, hereinafter referred to as transmit clock domain 101 and receive clock domain 102. The difference in clock signals on paths 105 and 106 can be a difference in only frequency or only phase or both. For example, the clock signals on path 105 and 106 may have the respective frequencies 50 MHz and 37 MHz. A signal on path 104 crosses from clock domain 101 to clock domain 102, and hence this signal (on path 104) is hereinafter called a clock-domain-crossing ("CDC") signal.

Although circuit 100 is illustrative of one clock-domain-crossing signal it is well known to the skilled artisan that today's integrated circuits have 100s of 1000s of such clock-domain-crossing signals and have 100s of clock domains. Moreover, the clock-domain-crossing signal on path 104 may pass through any amount of combinational logic 109 when traveling from transmit domain 101 to receive domain 102. Combinational logic 109 typically consists of any number of logic elements that are not clocked (i.e. there are no storage elements therein).

Each of portions 101 and 102 of circuit under verification 100 may contain any number of and any kind of circuit elements, e.g. storage elements that need to be clocked such as flip flops, as well as logic elements such as XOR gates and AND gates. For example, FIG. 1B shows a register 111 in the receive clock domain 102 of the circuit 100 of FIG. 1A. The D input of the register 111 of FIG. 1B is connected to the path 104 of FIG. 1A and therefore receives the clock-domain-crossing signal from domain 101. Moreover, the Q output of the register 111 of FIG. 1B generates a signal RX_Q that may be provided to any additional circuitry 191 in receive clock domain 102.

FIG. 1C shows another register 112 that is located in the transmit clock domain 101 of the circuit 100 of FIG. 1A. Register 112 has a Q output which drives the clock-domain-crossing signal on path 104. The D input of the register 112 of FIG. 1C receives a signal TX_D from any additional circuitry 192 in the transmit clock domain 101. The above-described additional circuitry 191 and 192 are each normally clocked by their respective clock signals on paths 105 and 106 respectively (and for this reason they belong to their respective clock domains).

It is well known in the art to verify the functional behavior of circuit 100 (which is also referred to as "circuit-under-verification"), based on a circuit description, by use of conventional register-transfer-level (hereinafter, RTL) simulators such as VCS (from Synopsys, Inc.) and Verilog NC (from Cadence Design Systems, Inc.). The circuit description for circuit 100 is normally articulated by a circuit designer in a Hardware Description Language (HDL), such as Verilog. Note that instead of a Verilog representation, circuit 100 may be described in any other HDL, such as VHDL, or in an internal representation (such as a graph structure or a net list structure) in a programmed computer as will be apparent to the skilled artisan.

A designer of circuit 100 may additionally articulate a description of one or more assertions that monitor various signals in circuit 100 that normally occur during simulation. The assertions (also called "checkers") are articulated to generate error signals when a certain combination of signals in circuit 100 cause a condition specified in the assertion to be violated during simulation. Assertions can receive signals from either or both portions 101 and 102 of circuit 100, depending on the assertion.

FIG. 1A illustrates an assertion 103 that receives input signals on paths 108 and 107 respectively from each of the two clock domains 101 and 102. Note that paths 107 and 108 are shown dashed in FIG. 1A to indicate that the paths are not necessarily present in a circuit description, e.g. assertion 103 may receive signals only on path 108 or only on path 107 or on both paths 107 and 108 depending on the circuit design and/or the assertion. For more information on assertions, see U.S. Pat. Nos. 6,175,946 and 6,609,229 granted to Ly et al that are incorporated by reference herein in their entirety.

During simulation of circuit 100 (FIG. 1A) with conventional RTL simulators, assertion 103 does not receive certain signals that result from the effects of metastability, because metastability is not modeled explicitly in prior art systems. In contrast, metastability effects are known to arise in physical implementations of circuit 100, due to the difference in the two clock signals on paths 105 and 106. Specifically, a physical register implemented in silicon, for example, the register in FIG. 1B that receives the clock-domain-crossing signal of FIG. 1A, is characterized by parameters called "setup time" and "hold time". If a signal at the data input of the physical register changes logic values within the setup time before the active edge of the register's clock signal, or within the hold time after the active edge of the register's clock signal, then the output of the register becomes unpredictable, and may settle to either logic value 1 or logic value 0. For more information, see "Digital Systems Engineering," Dally, W. J., and Poulton, J. W., Cambridge University Press, 1998, pp. 462–513.

A clock-domain-crossing signal on path 104 changes its logic value during the setup time or during the hold time of register 111 in the receive clock domain 102 due to the relative difference in times at which the two clock domains 101 and 102 are clocked by their respective clock signals on paths 106 and 105. FIGS. 2A and 2B show representative electrical waveforms for the output of a physical register in the physical world that has been implemented in silicon (as an integrated circuit die), in situations where the clock-domain-crossing signal violates the setup time of this register 111.

In FIG. 2A, a signal at the output of register 111 initially goes only part way to logic level 1 and then settles to logic level 0 whereas in FIG. 2B the same signal initially goes only part way to logic level 1 and then settles to logic level 1. Similarly, FIGS. 2C and 2D show the corresponding electrical waveforms when the hold time of the physical register 111 is violated and the output signal settles to logic level 1 and logic level 0 respectively. The logic level to which a signal settles in the physical world i at the output of a physical register 111 depends on a number of factors (such as thermal effects and/or voltages) that are not normally modeled in conventional RTL simulation.

FIGS. 3A and 3B show representative simulation waveforms produced by conventional RTL simulation of the circuit 100 of FIG. 1A in cases where a signal at the data input of a register 111 in the receive clock domain 102 violates the setup time and hold time parameters. As can be seen by comparing FIG. 3A with FIGS. 2A and 2B and by comparing FIG. 3B with FIGS. 2C and 2D, the electrical waveforms of the physical register may differ from the simulation waveforms produced by conventional RTL simulation when the setup or hold time parameter of the register is violated. Note that only one outcome is produced by the RTL simulator when the setup time is violated as shown in FIG. 3A. Similarly only one outcome is produced when the hold time is violated as shown in FIG. 3B. The outcome produced by the RTL simulator is also called the "correct" logic value, and the inversion of the outcome produced by the RTL simulator is also called the "incorrect" logic value.

In contrast, when a signal at the data input of a physical register in the physical world changes logic values within the setup time before the active edge of the register's clock signal, then the signal at the output of the physical register in the physical world may settle to either a "correct" logic value (i.e., a value matching the value produced by conventional RTL simulation of the register), or an "incorrect" logic value (i.e., the inversion of the value produced by conventional RTL simulation of the register), as shown in FIGS. 2A and 2B. Similarly, two outcomes are possible when the signal changes within the hold time after the active edge of the register's clock signal, as shown in FIGS. 2C and 2D.

An example circuit 400 shown in FIG. 4A is similar or identical to the corresponding circuit 100 described above, except for the following differences. The reference numerals in FIG. 4A are obtained from the corresponding reference numerals in FIG. 1A by adding 300. Circuit 400 includes multiple paths (e.g. n paths) in a bus 404 between the two clock domains 401 and 402. In this example, the n-bit signal on bus 404 that crosses clock domains 401 and 402 happens to have been designed by the circuit designer to be one-hot, which satisfies the property that exactly one bit of the n-bit signal is asserted at all times during normal operation.

Note that in circuit 400 of FIG. 4A, assertion 403 is coupled to only the receive clock domain 402 to receive therefrom a version of the n-bit signal after it has been clocked in by receive clock domain 402 (which receives this signal on path 404 from transmit clock domain 401). Assertion 403 may be articulated by the designer of circuit 400 to be a one-hot assertion which checks that the signal on path 407 is in fact one hot (i.e. that exactly one bit of the n-bit signal is asserted at all times). Assertion 403 contains an XNOR gate 421 that receives signals RX_Q_1 and RX_Q_0 that are output by registers 411_1 and 411_0. XNOR gate 421 supplies an error signal when its inputs are the same and this error signal is latched in a register 422 also included in assertion 403. Note that assertion 403 is not connected to transmit clock domain 401 in this example although in other examples such an assertion may be connected to only transmit clock domain 401, or to both clock domains.

An example of circuit 400, for n=2, is described next, in reference to FIG. 4B. Transmit clock domain 401 contains two registers that form a one-hot counter 412 (see registers 412_1 and 412_0, together called "tx_reg"). Counter 412 is clocked by the rising edge of the transmit clock signal TX_CLK. When the reset signal RST, is asserted, register 412_1 is set to 0 (deasserted) and register 412_0 is set to 1 (asserted). At each rising edge of the transmit clock signal TX_CLK after the reset signal RST is deasserted, the values stored in registers 412_1 and 412_0 are swapped. Therefore, the counter 412 (called "tx_reg" which is a short form for "transmit register") remains one-hot at all times after reset.

In the example circuit of FIGS. 4B and 4C, the one hot signal from tx_reg counter 412 (i.e. from registers 412_1 and 412_0) is clocked into a counter 411 (formed by registers 411_1 and 411_0 that are together called "rx_reg" which is a short form for "receive register"), on each rising edge of receive clock signal RX_CLK. As described above, since input signal TX_Q_0 is clocked into receiving register 411_0 by a first clock signal (RX_CLK), transmitting register 412_0 is in the combinational fanin of signal TX_Q_0, and register 412_0 is clocked by a second clock signal (TX_CLK), it follows that signal TX_Q_0 is a clock-domain-crossing ("CDC") signal. Note that signal TX_Q_0 transmitted by the transmit clock domain 401 on path 404_0 is same as signal RX_D_0 that is received by the receive clock domain 402 at the D input of register 411_0. In a similar manner, note that signal TX_Q_1 is a CDC signal also, and is same as signal RX_D_1 received at the D in put of register 411_1.

A Verilog representation of circuit 400 of FIG. 4B is shown in Appendix A which is located just before the claims in this patent application. Appendix A is an integral portion of this background section of this patent application and is incorporated by reference herein in its entirety. For a description of the Verilog language, see "The Verilog Hardware Description Language, Second Edition" Thomas, D. E., and Moorby, P. R., Kluwer Academic Publishers, 1995. In the Verilog of FIG. 4B, registers 411_1, 411_0, 412_1 and 412_0 are represented as rx_reg_1, rx_reg_0, tx_reg_1, and tx_reg_0 respectively. Moreover, signal names shown in upper case letters in FIG. 4B are replaced by corresponding names in lower case letters in Appendix A. Note that the initial state represented in the initial block of the Verilog shown in Appendix A corresponds to the reset state of the circuit under verification, i.e., tx_reg_1=0, tx_reg_0=1, rx_reg_1=0, and rx_reg_0=1.

As noted above, circuit 400 of FIG. 4B contains assertion 403 to check that the value stored in the rx_reg counter 411 is in fact one-hot (see lines 42–44 in Appendix A). The output of the one-hot assertion 403 becomes asserted when the assertion is "violated", if and only if the value stored in rx_reg counter 411 is not one-hot at the rising edge of the receive clock signal RX_CLK. During conventional RTL simulation, a violation flagged by the one-hot assertion 403 indicates that the value of the rx_reg counter 411 is not one-hot.

The just-described error in the rx_reg counter 411 is treated by a circuit designer as an indication that an error occurred in the generation of the one-hot signal but not that the one-hot signal was corrupted during transmission across clock domains. This is because conventional RTL simulators such as VCS and NC Verilog do not accurately model metastability affecting the CDC signals. Therefore, during conventional RTL simulation of the example circuit 400 of FIG. 4B, the value of the tx_reg counter is modeled as being correctly transmitted to the rx_reg counter, regardless of the violation of set up times (of registers 411_0 and 411_1). For this reason, when the one-hot signal is correctly generated and stored in the tx_reg counter 412 the one-hot assertion 403 that monitors the signal on path 107 is not violated during conventional RTL simulation.

As noted above, RTL simulation in the conventional manner produces only one outcome (i.e. one logic level) in the event of a setup time violation although two outcomes are possible. Moreover, RTL simulation also produces only one outcome (i.e. one logic level) in the event of a hold time violation, although two outcomes are possible. The inventors believe there is a need to take into account the outcomes that are not conventionally produced by RTL simulation. Specifically, the inventors believe that explicit modeling of all outcomes could lead to detection of errors that are not otherwise detected by RTL simulation.

Incorporated by reference herein in its entirety as background is an article entitled "Using Assertion-Based Verification to Verify Clock Domain Crossing Signals" by Chris Ka-Kei Kwok, Vijay Vardhan Gupta and Tai Ly presented at Design and Verification Conference (DVCon 2003), February, 2003.

SUMMARY OF THE INVENTION

Prior to verification of a description of a circuit containing a pre-determined assertion, the circuit description is automatically transformed in accordance with the invention by addition of description(s) of one or more circuits (also called "metastability injectors") to deliberately create one or more effects of metastability in the circuit. The transformed description (containing metastability injectors) is verified in the normal manner. Therefore, in some embodiments, use of metastability injectors during verification results in detection of incorrect behavior of the circuit (if present) that is caused by metastability in signals that cross clock domains in the circuit. Note that a circuit may be described in accordance with the invention (and the circuit description can be stored and used) in a programmed computer either in the form of HDL (such as Verilog or VHDL) or as an internal representation (such as a graph or a netlist).

During verification, certain embodiments analyze the transformed description using a formal verification method (such as model checking or. bounded model checking) to identify one or more specific stimulus sequence(s) that will cause the pre-determined assertion to be violated in simulation. One specific stimulus sequence identified by formal verification is used in simulation of the transformed circuit, to display to the circuit designer one or more simulation waveforms (on a computer screen) that indicate an incorrect behavior of the circuit in the presence of metastability. The circuit designer may analyze such simulation waveforms, to determine one or more sources of error, and if necessary change the circuit description to eliminate the incorrect behavior in a future iteration of verification (in the above-described manner). The designer may change the circuit description in any manner, including but not limited to implementing protocols to correctly transmit information between clock domains in the presence of metastability.

DETAILED DESCRIPTION

In accordance with the invention, a description of a circuit-under-verification ("CUV") is automatically transformed so that it explicitly models the effects of metastability, resulting in a transformed description (hereinafter, also called the "transformed CUV"). The transformed description may be verified in any manner. Specifically, an original description of the CUV (which may be prepared by a circuit designer in the normal manner) is transformed, by insertion of an extra circuit to inject metastability effects into the path of a clock-domain-crossing signal. The extra circuit (also called "metastability injector") has an enable input that is used to conditionally inject metastability effects into the transformed CUV.

Figure 1A:
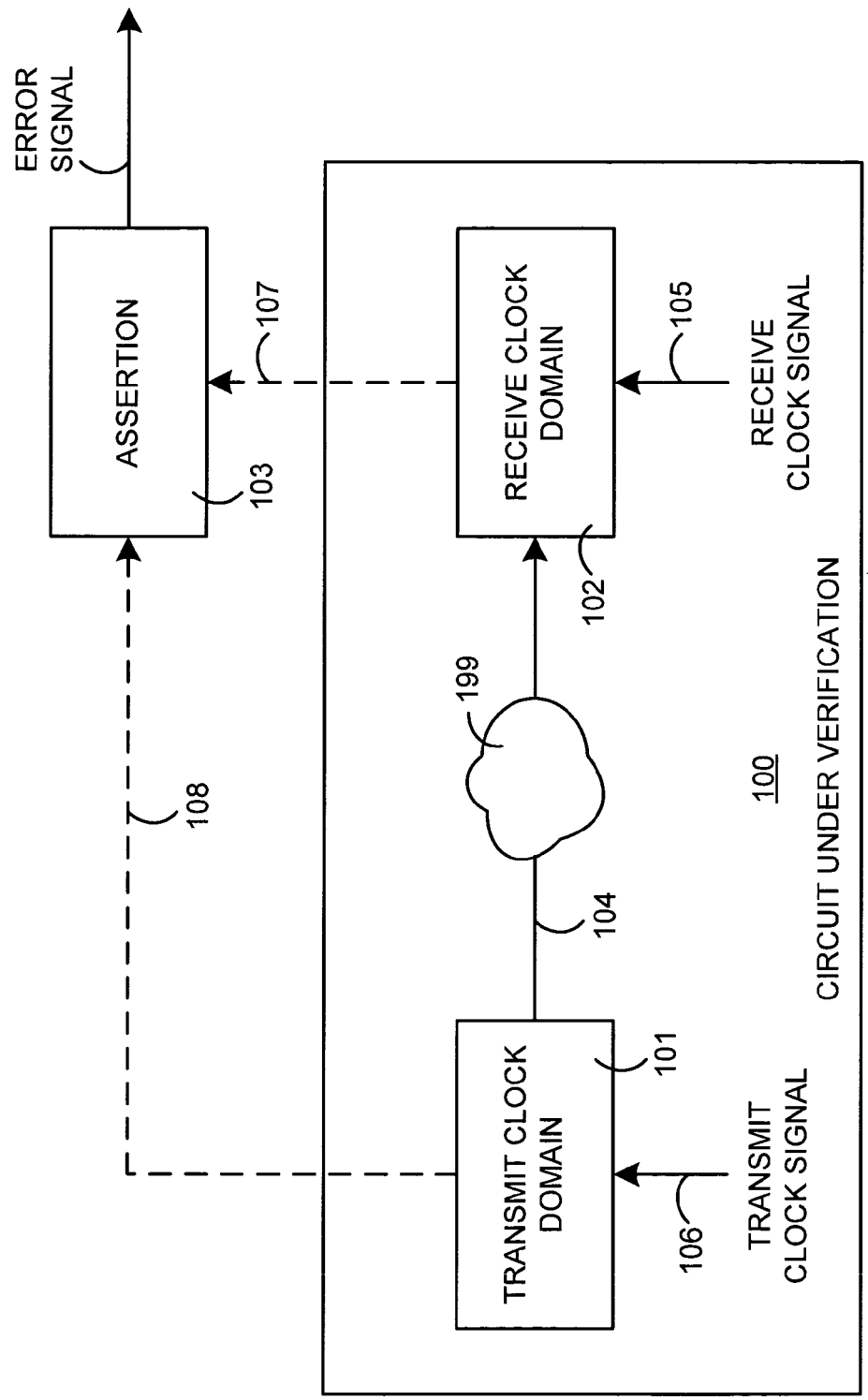
FIGS. 1A–1C illustrate, in block diagrams a prior art circuit with two clock domains, one CDC signal and one assertion.
Figure 5A:
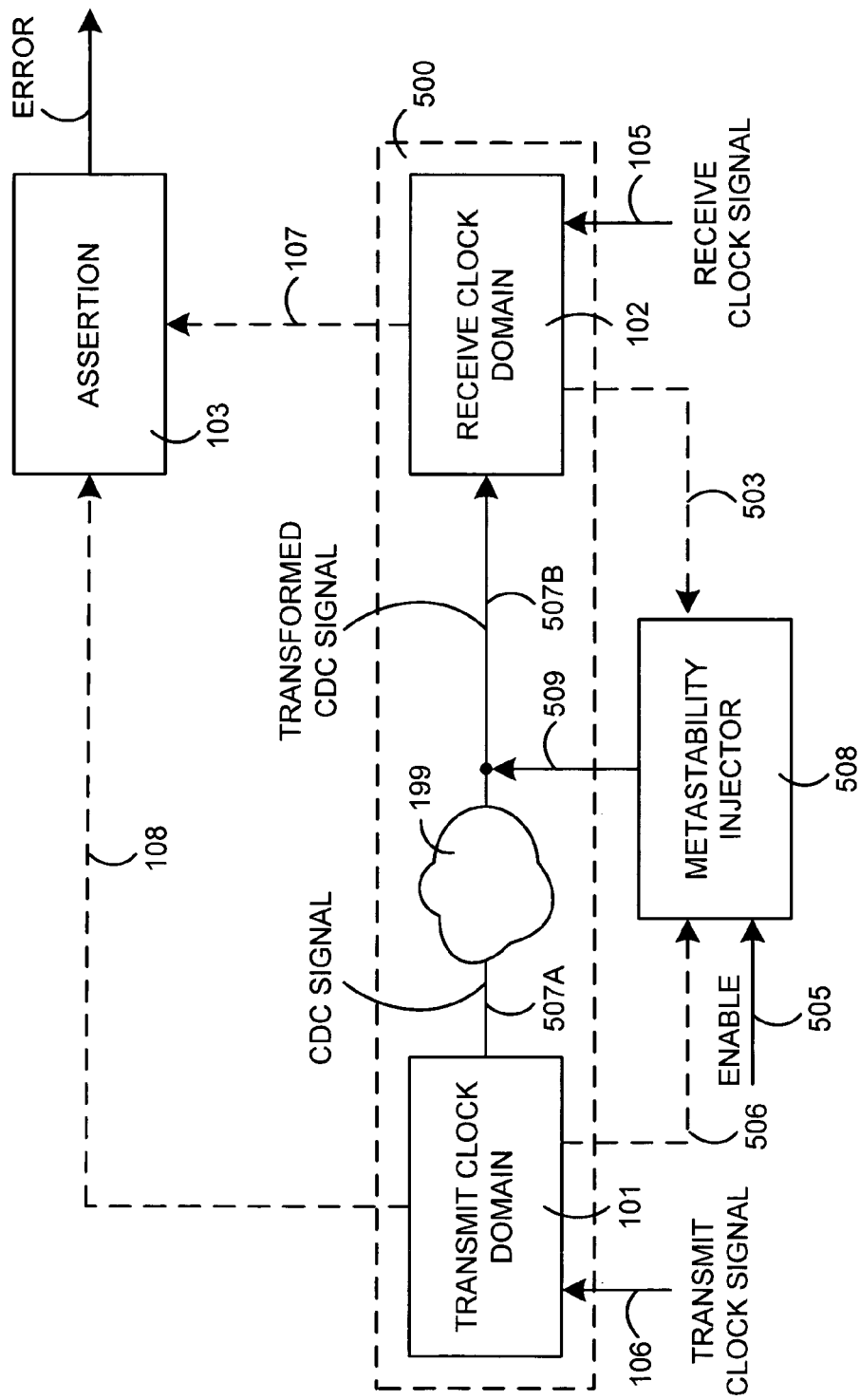
FIGS. 5A and 5B illustrate, in alternative embodiments, a metastability injector added in accordance with the invention, to the circuit-under-verification of FIG. 1A, to obtain a transformed circuit-under-verification.

FIG. 5A shows the result of transforming the original circuit 100 of FIG. 1A by adding a metastability injector 508. Note that the transmit clock domain 101 and receive clock domain 102 shown in FIG. 5A are similar or identical to the respective clock domains shown in FIG. 1A. Moreover, assertion 103 in FIG. 5A may also be same as or similar to an assertion 103 that is already pre-existing in an original circuit 100 (see FIG. 1A). Note that in some embodiments, a circuit designer may pre-determine (and optionally add) one or more assertions 103 for use with circuit 100, with such newly added assertions being intended to specifically detect errors resulting from metastability effects in the signal received on an input path 507B of the receive clock domain 102.

Note that in many embodiments, an assertion 103 that is violated as described herein is not deliberately selected but has only an indirect relationship to metastability (e.g. if the assertion is connected to the output of a register that is several sequential stages removed from the entry point of the CDC signal in the receive clock domain 102). Furthermore, in several embodiments, assertion 103 may be any assertion that monitors a portion of circuit 100 located in the transitive sequential fanout of the signal received on an input path 507B of the receive clock domain 102. Note that the transitive sequential fanout of signal S is a set of registers, R, constructed as follows: (a) set the set R to contain all registers with inputs in the combinational fanout of S; (b) repeat the following until the set R does not grow any larger: for each register X in the design, if X is not already in R and an input of X is in the combinational fanout of some register in R, then add X to R.

In the embodiment of FIG. 5A, path 507A originates in the transmit clock domain 101 in the manner described above in reference to path 104 of FIG. 1A. Note that the clock-domain-crossing (CDC) signal which is output by transmit clock domain 101 does not travel on path 507A always unaltered to the receive clock domain 102 in FIG. 5A. Instead, the CDC signal on the path 507A of FIG. 5A is modified by metastability effects that are output by metastability injector 508 on a path 509 that is connected to path 507A. Input path 507B of the receive clock domain 102 is connected to paths 507A and 509, Hence, in the circuit 500 of FIG. 5A, path 507B carries the modified CDC signal (also called 'metastable CDC signal') to the receive clock domain 102. Note that the above-described combinational logic 199 may be present between paths 507A and 507B at any location relative to path 509 (i.e. although in FIG. 5A path 507A is shown passing through logic 199 and path 509 is directly connected to path 507B, other embodiments may have path 507B passing through combinational logic 199 with path 509 being directly connected to path 507A, while still other embodiments may have both paths 507A and 507B passing through different portions of combinational logic 199). Therefore, the specific connections among paths 507A, 507B, 509 and combinational logic 199 are different depending on the embodiment.

Note that metastability injector 508 may add any kind of metastability effect to the CDC signal generated by transmit clock domain 101, depending on the embodiment. In some embodiments, metastability injector 508 simply inverts the CDC signal from path 507A, whenever there is a transition in the CDC signal. An inversion forced by metastability injector 508 may be disabled (so the result is same as in RTL simulation) or the forced inversion may be timed to happen at various times relative to the set up and hold times of the receiving register (not shown in FIG. 5A; see register 111 in FIG. 1A).

Specifically, metastability injector 508 may be disabled (by de-asserting an enable signal on path 505) all the time, in which case the CDC signal is left unaltered. Alternatively, metastability injector 508 may be disabled only until it becomes time for the transmit clock signal on path 106 to align with the receive clock signal on path 105 at which time metastability injector 508 is enabled. In some embodiments, the enable signal on path 505 is output by an AND gate (not shown) that receives as input a signal that is asserted during alignment of the two clock signals, and as another input a signal indicating that injector 508 is activated. Note that AND gate 524 is a 3-input gate that additionally receives the signal that is asserted during alignment (in addition to the signal on path 505 and the output of gate 523). The times at which two clock signals are considered to be aligned, depends on the particular embodiment. For example in some embodiments, the clock signals are considered to be aligned if the time between the rising edge of the transmit clock and the rising edge of the receive clock is less than the setup time of the receiving register, or if the time between the rising edge of the receive clock and the rising edge of the transmit clock is less than the hold time of the receiving register.

For example, in some embodiments, whenever there is a transition in the CDC signal (assuming it happens when the clocks are considered to be aligned), the modified CDC signal that is presented at the input of the receive clock domain 102 is obtained by the metastability injector inverting the CDC signal (i.e. the logic value is driven from 1 to 0 and from 0 to 1). Thus, when the next active edge of the receive clock occurs in the receive clock domain 102 (FIG. 5A), the value that is stored in the receiving register in clock domain 101 models the situation in which the physical receiving register (e.g. register 111 in FIG. 5C) enters the metastable state in the physical world and settles to the inverse of the logic value that would be produced by conventional RTL simulation of the non-transformed circuit.

In many embodiments of the type described herein, metastability injector 508 may be disabled by de-asserting a signal on a path 505 (FIG. 5A). Specifically, when the signal (also called "metastability enable") on path 505 is asserted, the metastability injector of such embodiments forces the receive clock domain 102 to clock a modified CDC signal into the receiving register 111. The modified CDC signal is either the unaltered version of the CDC signal when there is no transition in the CDC signal, or the inverted version of the CDC signal if there is a transition in the CDC signal.

When the metastability enable signal on path 505 is de-asserted, the metastability injector of such embodiments is disabled and hence it unconditionally allows the receive clock domain 102 to receive the unaltered version of the CDC signal (i.e. regardless of whether or not a transition is happening in the CDC signal). Thus, when an active edge of the receive clock occurs with the enable signal on path 505 deasserted, the value stored in the receiving register of receive clock domain 102 models the situation in which the physical receiving register enters the metastable state and settles to the same logic value as would be produced by conventional RTL simulation of the non-transformed circuit.

Note that a metastability enable signal of the type described above in reference to path 505 does not exist in the original description of circuit 100 (FIG. 1A), but this signal is used as a primary input during verification (e.g. in formal verification) to turn on and off metastability effects. Use of such a metastability enable signal introduces one primary input into the formal analysis for each clock-domain-crossing signal (i.e. over and beyond any primary inputs present in the original description of circuit 100). Therefore, if transformed circuit 500 has an n-bit bus that connects transmit clock domain 101 to receive clock domain 102, then "n" enable inputs are now present, to conditionally turn on and off the metastability effects in each of the "n" CDC signals. Transformed circuit 500 (FIG. 5A) models each of the two possible outcomes for receipt of each CDC signal in a receiving register in clock domain 102 to model metastability effects, depending on whether the enable signal on path 505 is asserted or deasserted.

Note that, if assertion 103 is found to be not violated regardless of whether one or more metastability injector(s) 508 are enabled or disabled, then the design of circuit 500 is deemed to be verified to withstand metastability effects. On the other hand, if assertion 103 is violated when one of the metastability injector(s) 508 is enabled, the circuit designer may re-design circuit 500 to withstand metastability effects. Note that due to a change in the path between the two clock domains 101 and 102, the clock domains 101 and 102 in FIG. 5A are together referred to as circuit 500 (instead of circuit 100 as per FIG. 1A).

Figure 1B:
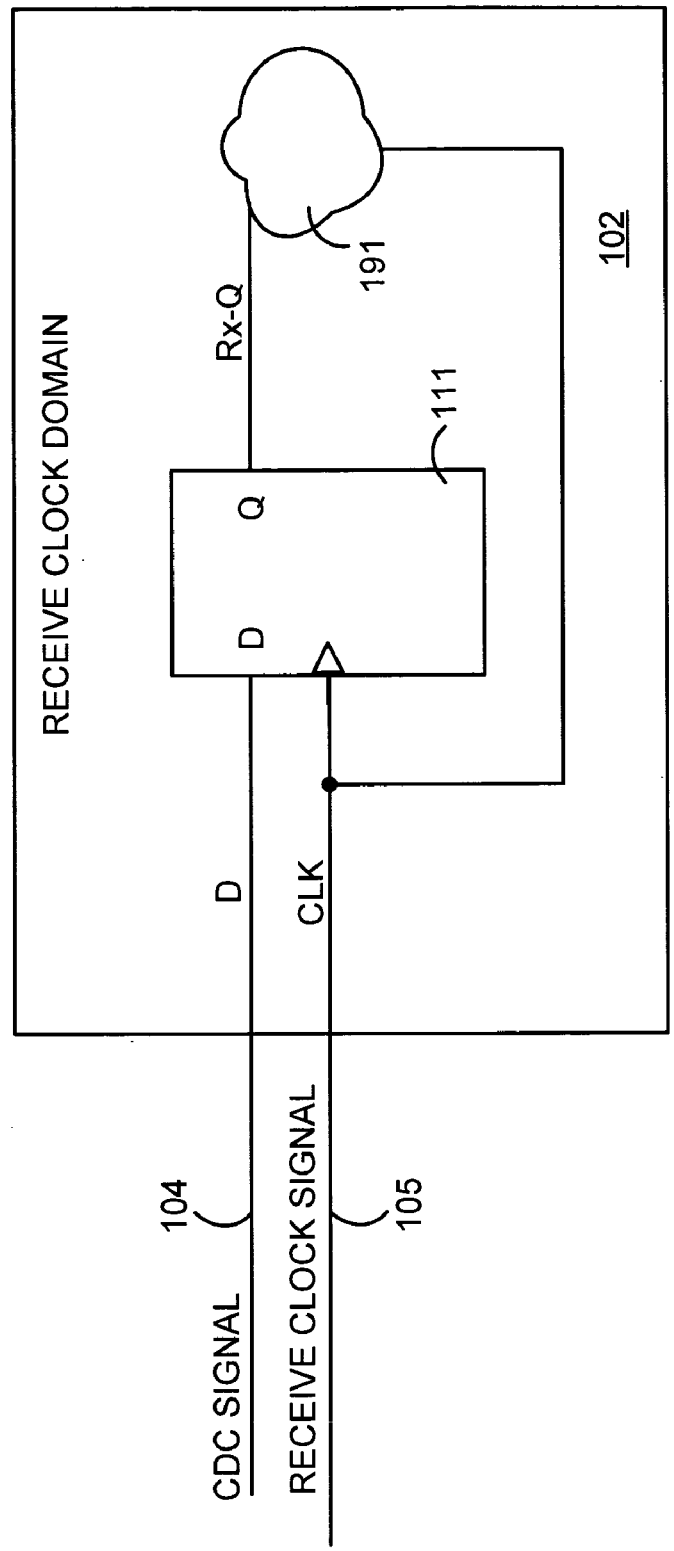
Figure 5B:
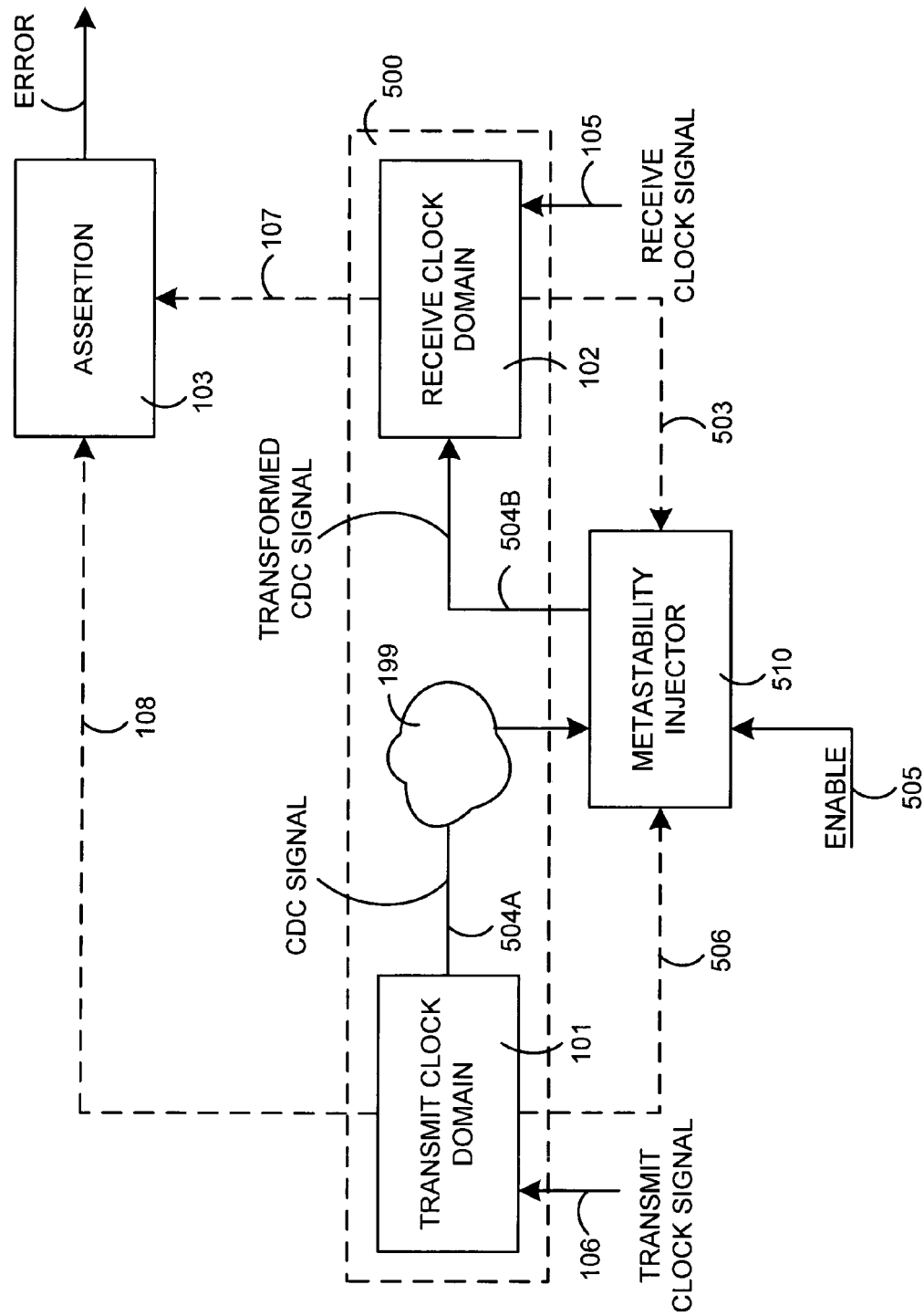

Certain embodiments of metastability injector 508 that are responsive to a transition in the clock-domain-crossing (CDC) signal, may detect the transition, inter alia, by use of one or more signals on path 506 from the transmit clock domain 101 or one or more signals on path 503 from the receive clock domain 102 or signals on both paths 503 and 506. Some embodiments of metastability injector 508 that are responsive to the transition in the CDC signal do not use any additional signals from clock domains 101 and 102, and instead directly monitor the CDC signal alone, to detect the transition. In the just-described embodiments, the metastability injector 508 does not have paths 503 and 506. The specific circuitry to be used in such a metastability injector 508 will be apparent to the skilled artisan in view of this detailed description In another embodiment which is illustrated in FIG. 5B, a path 504A that carries the clock-domain-crossing (CDC) signal from the transmit clock domain 101 is not directly connected to a path 504B that passes the modified CDC signal to the receive clock domain 102. Instead, path 504A terminates in metastability injector 510, and another path 504B originates in the metastability injector 510. The modified CDC signal is supplied on path 504B by injector 510, and this signal includes metastability effects therein In other embodiments, which are not shown, path 504B of metastability injector 510 may be coupled to the transmit clock domain 101 (e.g. to insert metastability effects into an earlier version of the CDC signal between the additional circuitry 192 and the last register 112 in the transmit clock domain 101 of FIG. 1C). In still other embodiments, which are also not shown, path 504B may be coupled between the additional circuitry 191 and the first register 111 in the receive clock domain 102 of FIG. 1B (e.g. to insert metastability effects into a later version of the CDC signal).

Metastability injector 510 of FIG. 5B can be implemented in any manner depending on the embodiment. In some embodiments, metastability injector 510 enabled by the signal on path 505, uses two versions of the clock-domain-crossing (CDC) signal to detect if a transition is happening in the CDC signal on path 504A. The two versions of the CDC signal may be, for example, the CDC signal on path 504A and an early version of the CDC signal obtained from the input of last register 112 in the transmit clock domain 101 (e.g. from the data input of the transmitting register in clock domain 101, i.e., the TX_D signal).

Figure 5C:
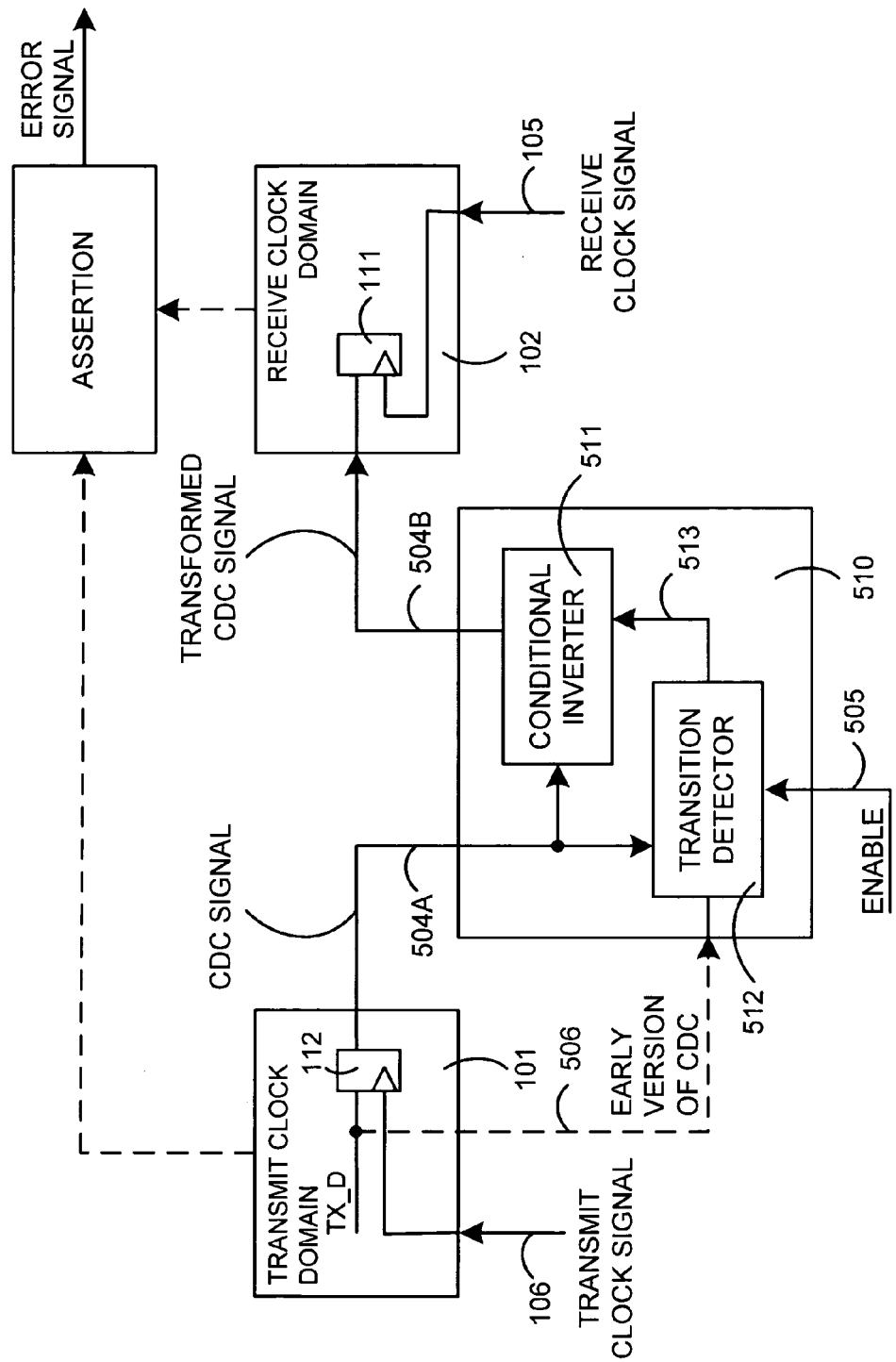
FIG. 5C illustrates, in a lower level block diagram, a transition detector and a conditional inverter that are included in a metastability injector of some embodiments of the invention.

Such an early version of the CDC signal may be obtained via the above-described path 506 (FIG. 5C) from transmit clock domain 101. In such embodiments, the early version of the CDC signal is compared with the CDC signal itself, in circuitry 512 (called "transition detector") that is located within metastability injector 510. Any difference between the two versions of the CDC signal is indicated by transition detector 512 asserting a signal at its output on a path 513 (FIG. 5C). Note that in the embodiments illustrated in FIG. 5C, the enable signal on path 505 is supplied directly to transition detector 512 to enable or disable its operation (when disabled, the signal on path 513 is deasserted regardless of transitions on path 504A). Note also that although in some embodiments transition detector 512 has been described and illustrated as comparing two versions of the CDC signal (i.e. the logic values on paths 506 and 504A), in other embodiments the transition detector may use only the CDC signal itself as noted above.

Figure 5D:
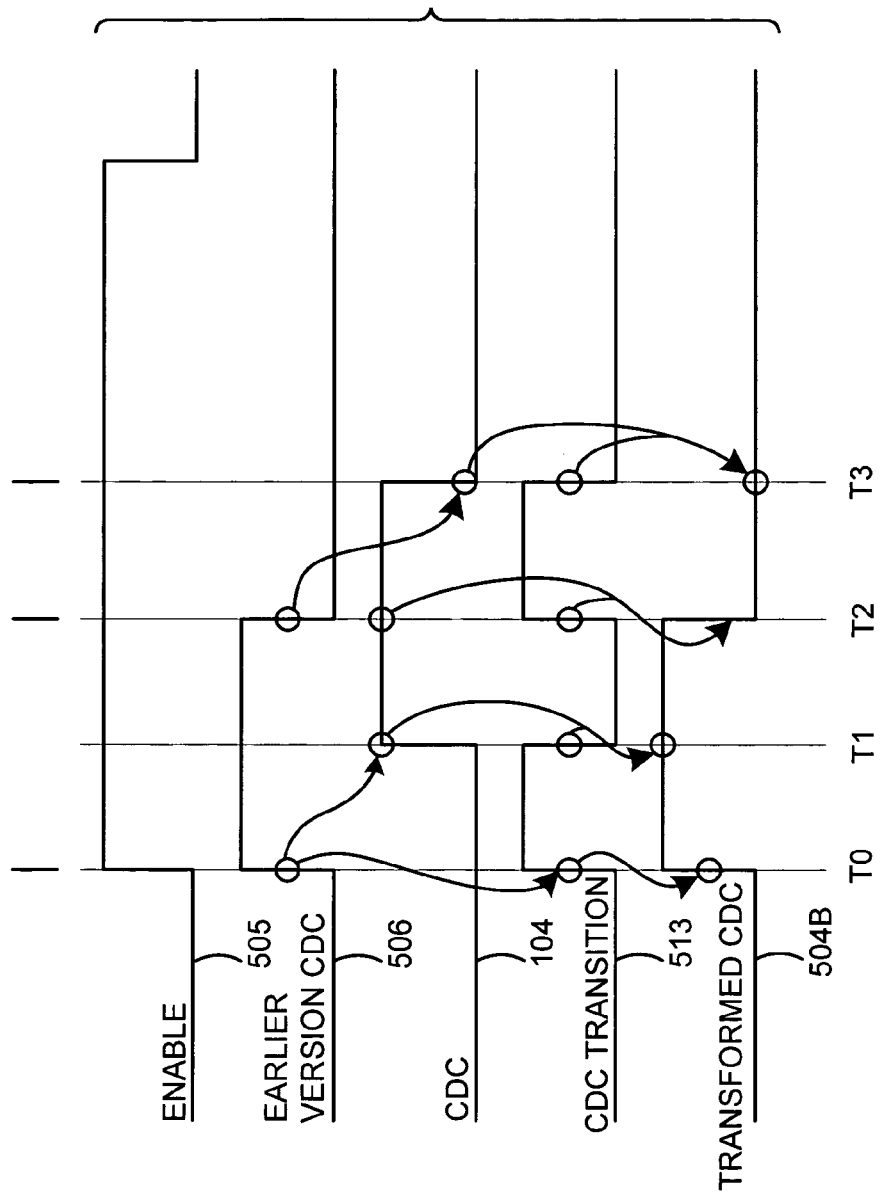
FIG. 5D illustrates, in a graph, waveforms of various signals in a metastability injector of one embodiment.

In some embodiments, transition detector 512 compares a current version of the CDC signal with an early version of the CDC signal, to detect whether a transition is going to happen in the CDC signal at the next clock cycle. The signal generated by transition detector 512 on path 513 (also called CDC transition) is illustrated in FIG. 5D in the case of a CDC signal on path 504A (FIG. 5C) that is low at time T0, goes high at time T1 and stays high for two clock cycles and goes low at time T3. As shown in FIG. 5D, the early version of the CDC signal on path 506 exhibits the same behavior as the CDC signal on path 504A but it is shifted earlier by one clock cycle. The CDC transition signal on path 513 goes high for one clock cycle before the CDC signal goes high i.e. between times T0 and T1. The CDC transition signal on path 513 also goes high for one clock cycle before the CDC signal goes low i.e. between times T2 and T3.

Referring to FIG. 5C, the CDC transition signal on path 513 controls a circuit 511 that is also included in metastability detector 510 of these embodiments. Circuit 511 (also called 'conditional inverter') conditionally supplies on path 504B (to the receive clock domain 102), either an inverted version or an unaltered version of the CDC signal received on path 504A (from the transmit clock domain 101), depending on whether or not the signal on path 513 is asserted. As noted above, the signal on path 513 is asserted by the transition detector 512 whenever there is a transition in the CDC signal on path 504A.

In the above-described example, the CDC transition is high between times T0 and T1 (as shown in FIG. 5D) which causes the modified CDC signal on path 504B to go high between times T0 and T1 (inverse of the low value in the CDC signal between times T0 and T1). Note that at time T1, the CDC transition signal becomes low and hence the modified CDC signal goes high (due to pass-through of the high value in the CDC signal between times T1 and T2). The remaining transitions at times T2 and T3 in the modified CDC signal are shown in FIG. 5D and their behavior will be apparent to the skilled artisan in view of this detailed description.

Depending on the embodiment, an early version of the CDC signal for use in a transition detector 512 as described above may be obtained from an input of any storage element in the transmit clock domain 101, in the transitive sequential fanin of CDC signal. Transitive sequential fanin of the CDC signal is consistent with use of this term in art, i.e. a set of registers, R, constructed as follows: (1) set the set R to contain all registers with outputs in the combinational fanin of S; (2) repeat the following until the set R does not grow any larger: for each register X in the design, if X is not already in R and the output of X is in the combinational fanin of some register in R, then add X to R. As noted above, some embodiments use as the early CDC signal a signal that is received from additional circuitry 192 (FIG. 1C) at the input of the very last storage element 112 in the transmit clock domain 101 that supplies the CDC signal.

Also note that in other embodiments, instead of an early version of the CDC signal, a later version of the CDC signal may be used in a transition detector in a manner identical to that described above (although the transition detection will occur later). As noted above, depending on the embodiment, a transition detector 512 in metastability injector 510 may use only the CDC signal itself as input (instead of two versions of the CDC signal).

Figure 5E:
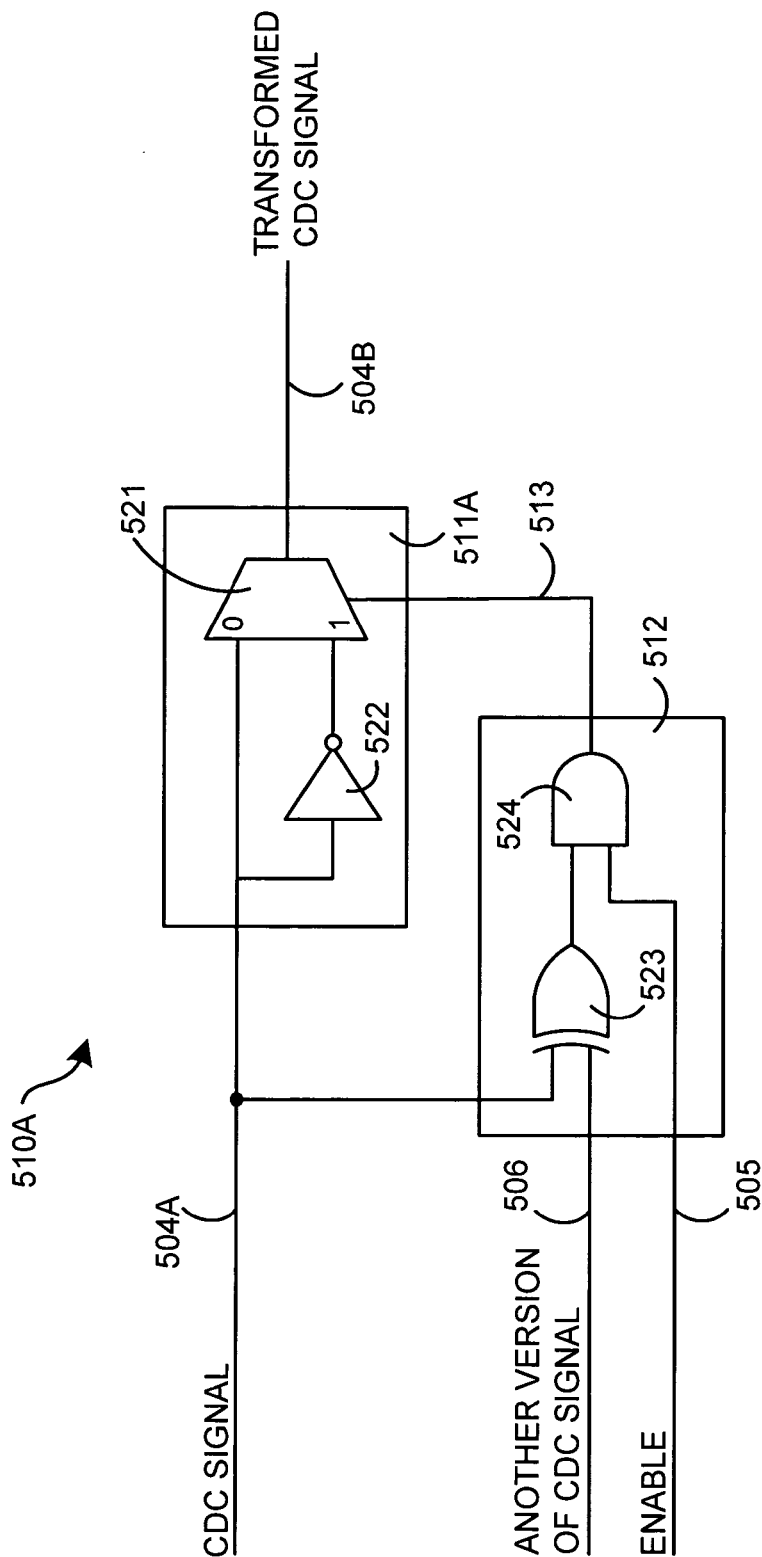
FIGS. 5E and 5F illustrate two exemplary implementations of a metastability injector of some embodiments.
Figure 5F:
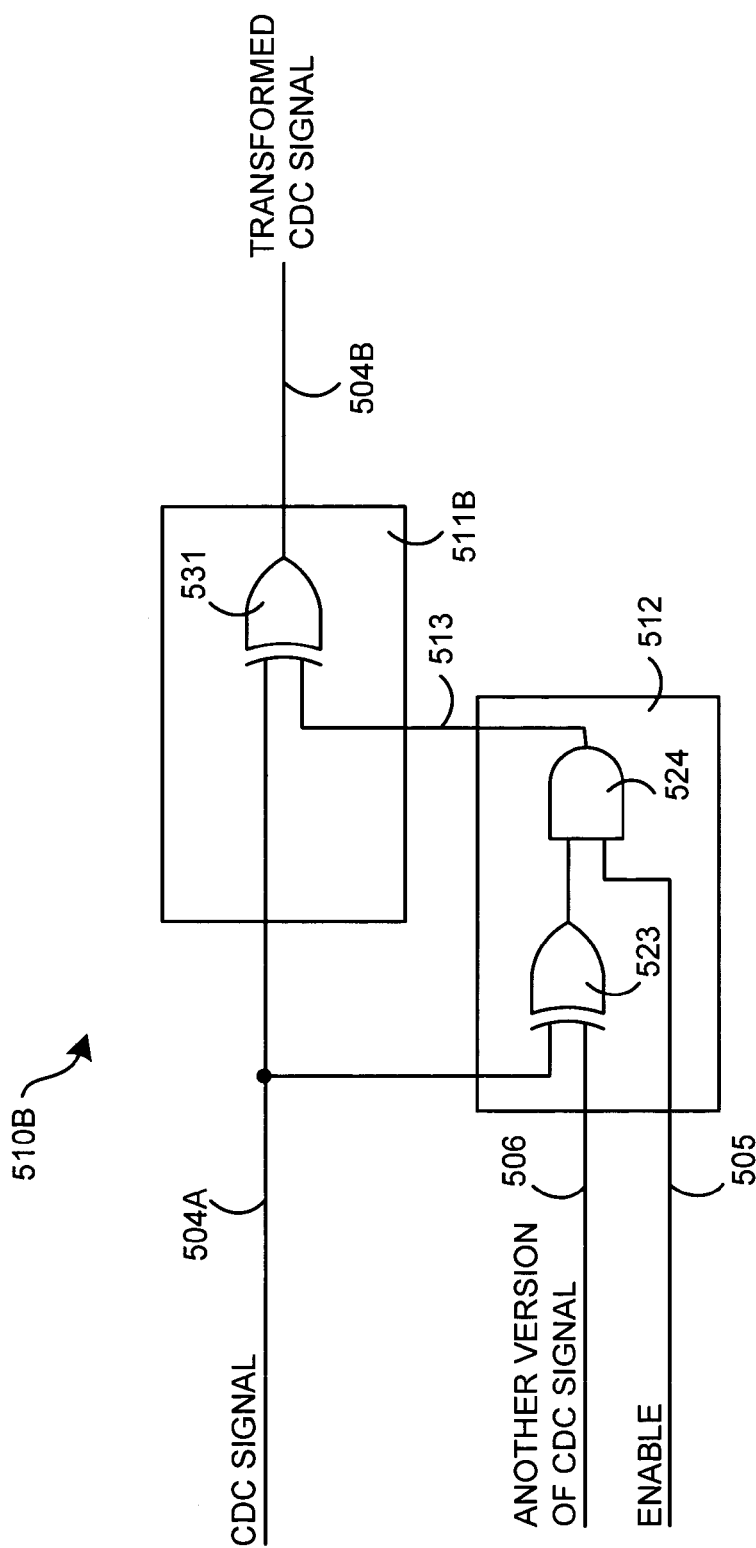

FIGS. 5E and 5F illustrate two alternative embodiments of a metastability injector 510 of the type illustrated in FIG. 5C, although numerous such embodiments will be apparent to the skilled artisan in view of this detailed description. Accordingly several features illustrated in FIGS. 5E and 5F are merely educational and are not intended to limit the scope of the invention. In both embodiments illustrated in FIGS. 5E and 5F, a transition detector 512 is implemented by an exclusive OR gate 523 that receives the two versions of the clock-domain-crossing (CDC) signal on paths 504A and 506, and an output signal from gate 523 is supplied to an AND gate 524 that also receives as input the above-described metastability enable signal on path 505. The signal output by AND gate 524 is supplied as the CDC transition signal on path 513.

Note, however, that conditional inverter 511 of metastability injector 510 is implemented differently in the two embodiments illustrated in FIGS. 5E and 5F, as noted next. Specifically, one conditional inverter 511A which is illustrated in FIG. 5E has a multiplexer 521 that is controlled by the CDC transition signal on path 513 to supply one of two inputs to path 504B, namely either the CDC signal directly from path 504A or an inverted form of the CDC signal generated by an inverter 522 (that is also coupled to path 504A). Another conditional inverter 511B which is illustrated in FIG. 5F has an exclusive OR gate 531 that receives as its two inputs, the CDC transition signal on path 513 and the CDC signal directly from path 504A. The output of the exclusive OR gate 531 is directly supplied as the modified CDC signal on path 504B.

Figure 1C:
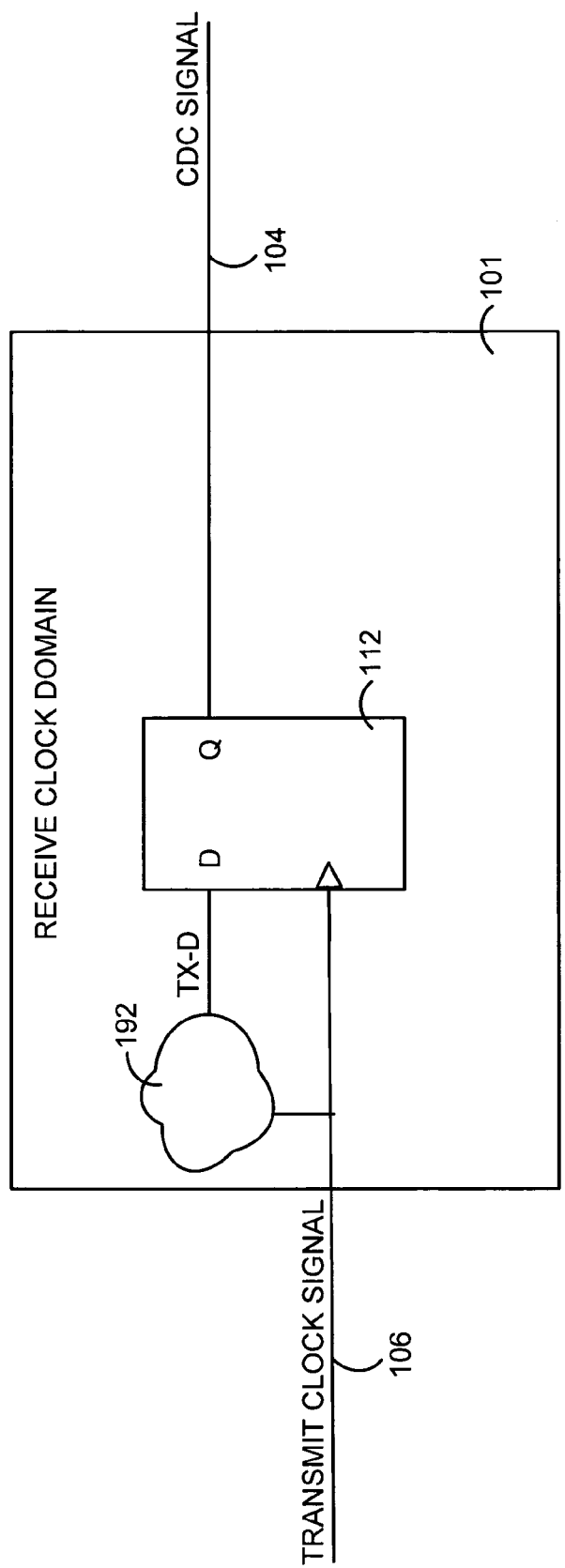
Figure 2A:
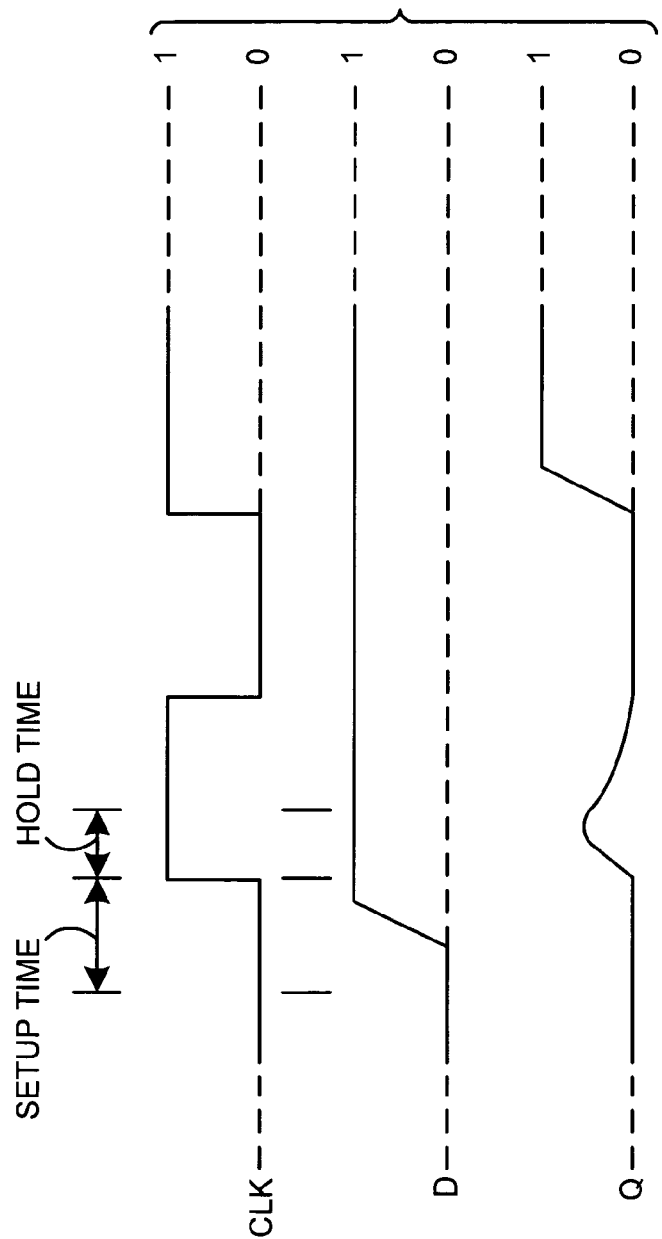
FIG. 2A shows representative electrical waveforms for physical register 111 of FIG. 1B showing violation of the setup-time parameter followed by the Q output entering the metastable state followed by the Q output settling to the incorrect logic value.
Figure 2B:
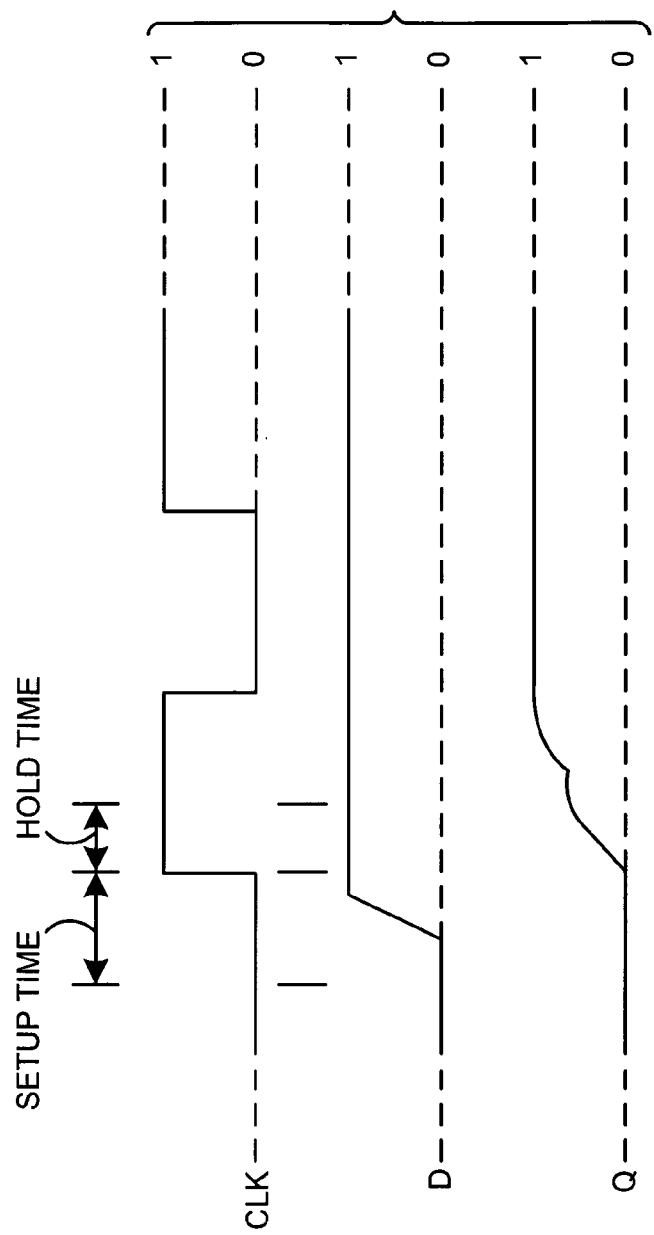
FIG. 2B shows representative electrical waveforms for physical register 111 of FIG. 1B showing violation of the setup-time parameter followed by the Q output entering the metastable state followed by the Q output settling to the correct logic value.
Figure 2C:
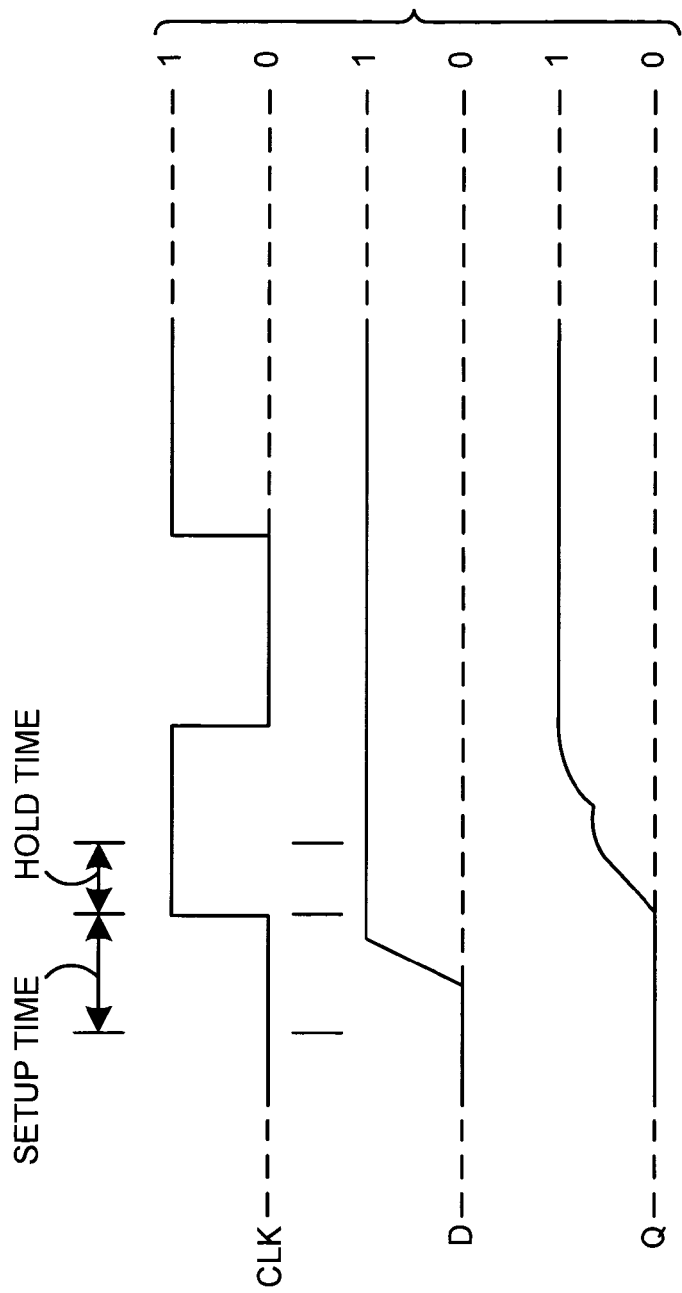
FIG. 2C shows representative electrical waveforms for physical register 111 of FIG. 1B showing violation of the hold-time parameter followed by the Q output entering the metastable state followed by the Q output settling to the incorrect logic value.
Figure 2D:
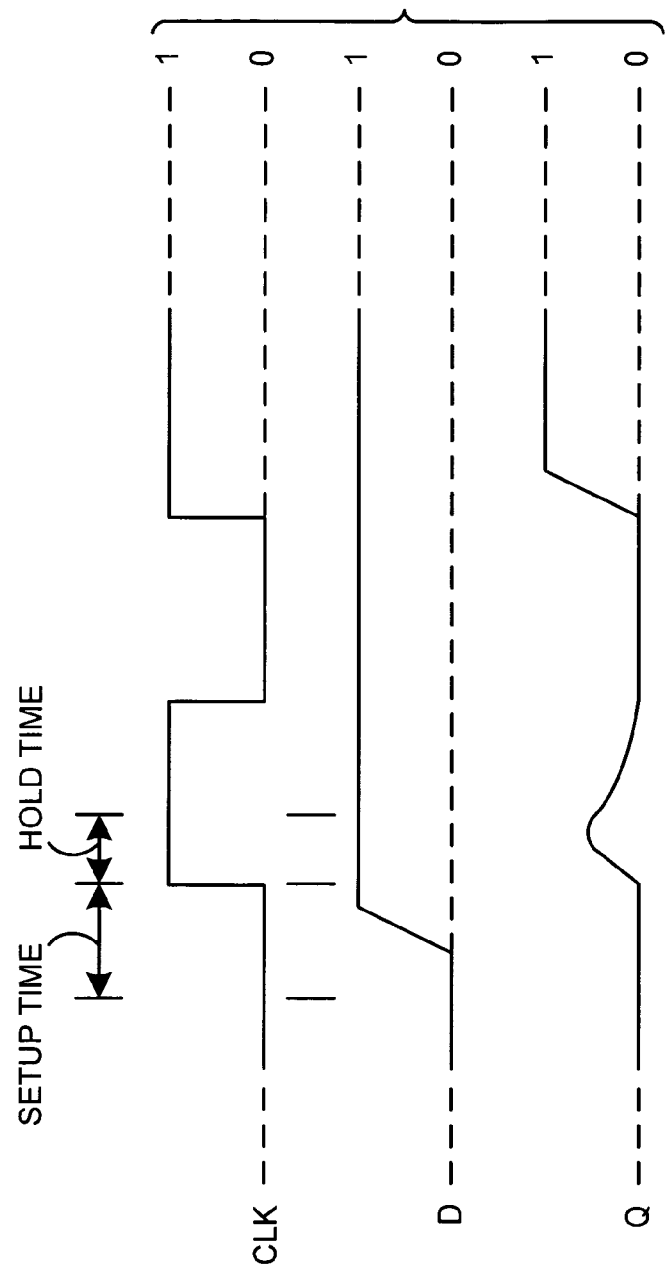
FIG. 2D shows representative electrical waveforms for physical register 111 of FIG. 1B showing violation of the hold-time parameter followed by the Q output entering the metastable state followed by the Q output settling to the correct logic value.
Figure 3A:
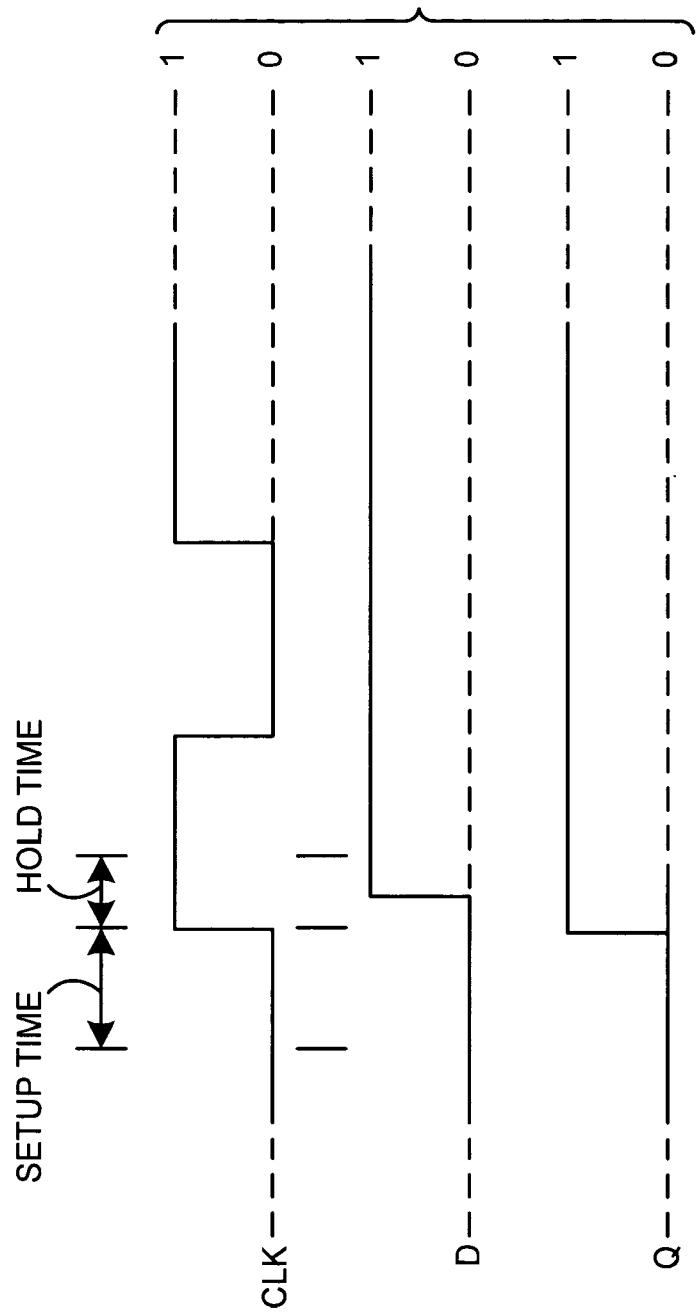
FIG. 3A shows simulation waveforms from conventional RTL simulation of a model of register 111 of FIG. 1B showing violation of the setup-time parameter and the resulting Q output produced.
Figure 3B:
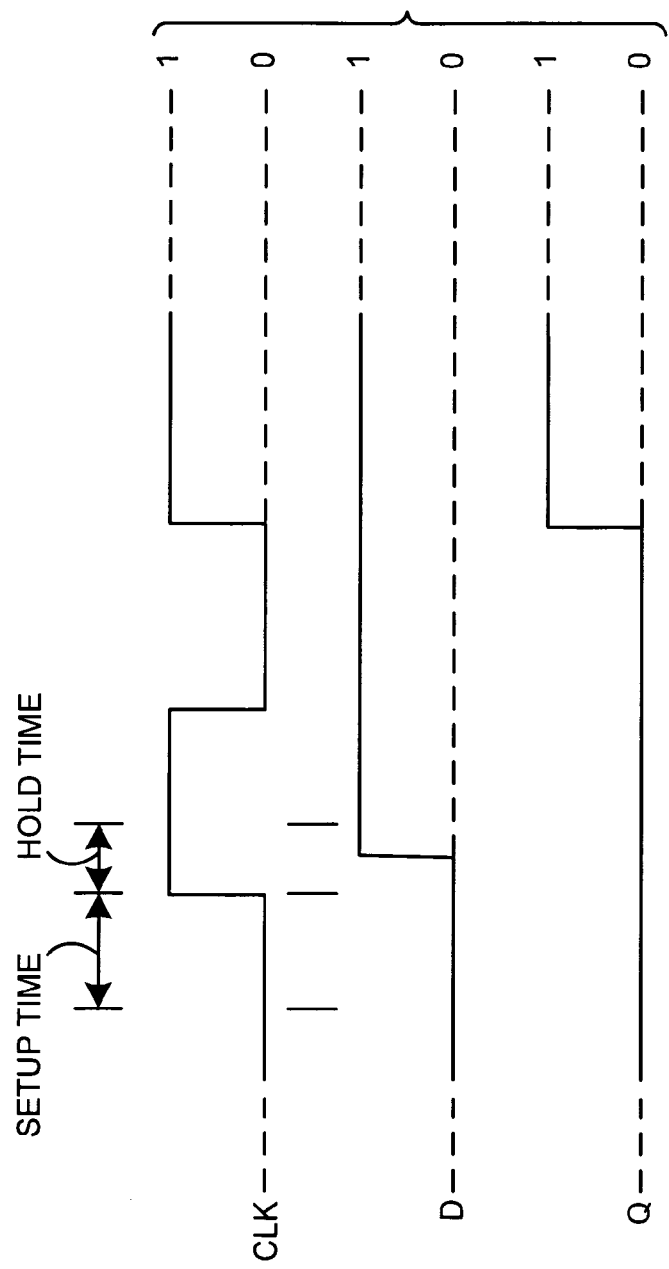
FIG. 3B shows simulation waveforms from conventional RTL simulation of a model of register 111 of FIG. 1B showing violation of the hold-time parameter and the resulting Q output produced.

Many alternative embodiments of the metastability injector will be apparent to a person skilled in the art, including embodiments that use signals from the transmit clock domain other than the CDC signal and the TX_D signal at the "D" input of the transmitting register 112 (see FIG. 1C).

Figure 6A:
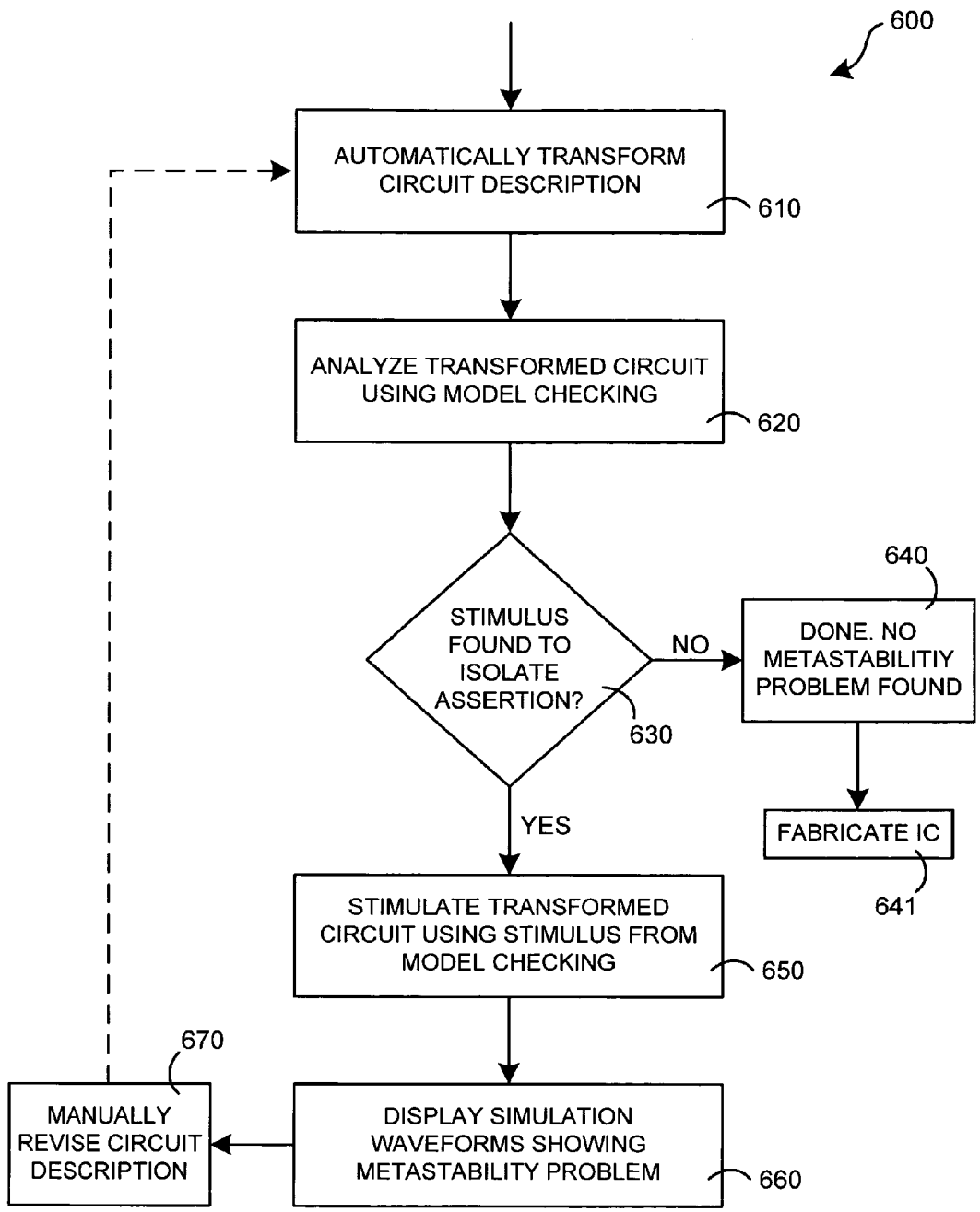
FIG. 6A illustrates, in a flowchart, one embodiment of the method of the invention.
Figure 6B:
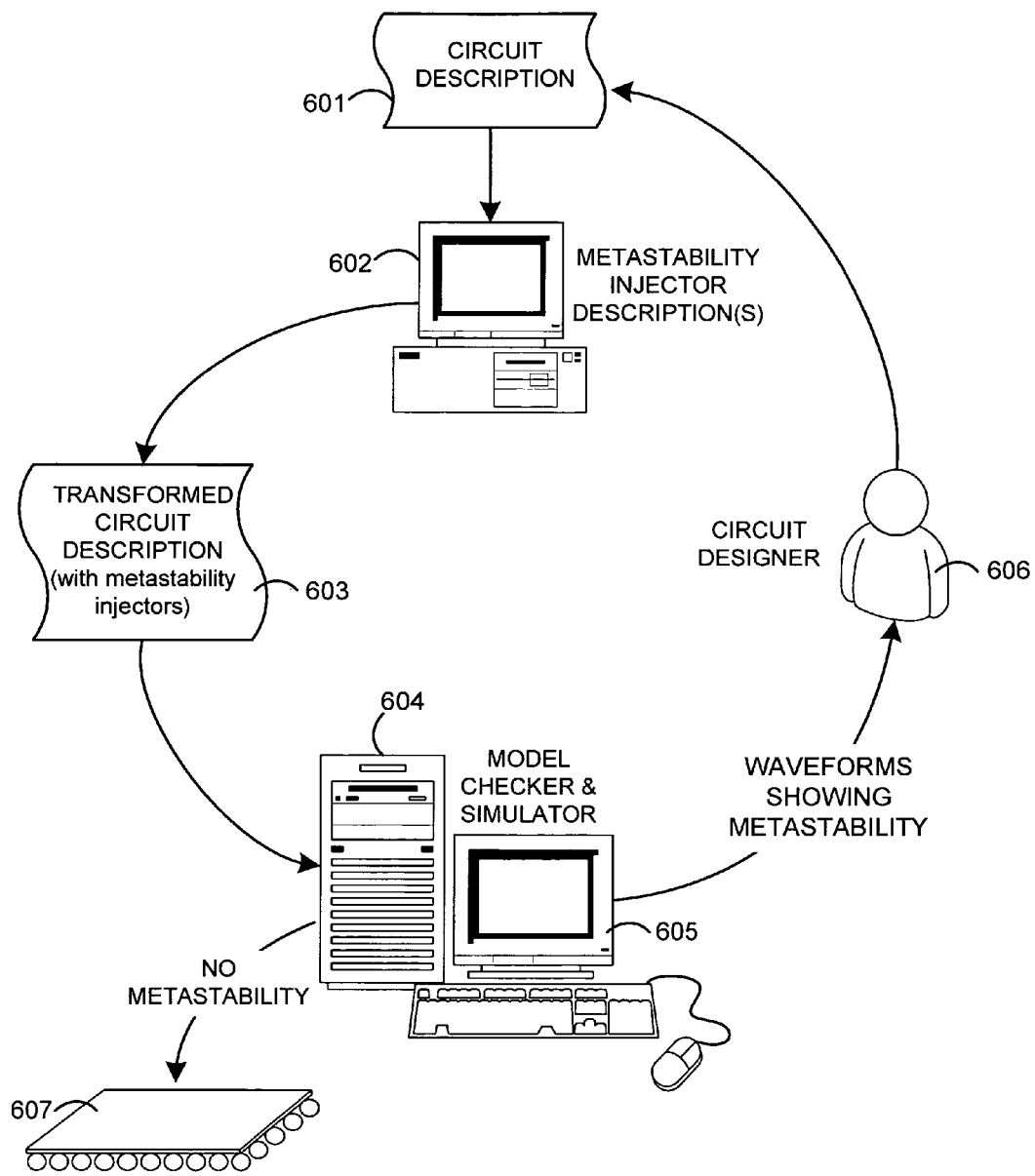
FIG. 6B illustrates, in a high-level block diagram, a flow of information when performing the method of FIG. 6A.

A verification method 600 used in some embodiments of the invention is illustrated in FIG. 6A. Specifically, a description 601 (e.g. expressed in Verilog, or VHDL) of the circuit under verification (see FIG. 6B) is automatically transformed by programmed computer 602 as per act 610 (FIG. 6A), by adding description of circuitry to inject effects of metastability into the circuit under verification, resulting in a transformed description 603. Specifically, one or more metastability injectors of the type described above in reference to FIGS. 5A and 5B may be added by computer 602 in act 610, to obtain the transformed description 603. Note that the metastability injectors are added for each CDC signal in circuit description 601.

Each CDC signal in description 601 is found automatically as follows by computer 602 that is appropriately programmed as follows. Computer 602 looks at each register in description 601 and checks if the register's combinational fanin contains another register and if so, whether these two registers have different clock signals. If they do have different clock signals, then the signal between the two registers is deemed to be a CDC signal. Next, a metastability injector is inserted in the manner described herein, for the just-found CDC signal.

Note that some embodiments build a netlist from the description 601, and traverse the netlist for each register, to find all registers that drive the data input of the current registers and if any of these registers are clocked by a different clock then the path between the two registers with different clocks is a CDC signal. Note that only combinational logic (in terms of logic elements) separates these two registers with different clocks.

Note that circuit description 601 may or may not contain one or more pre-determined assertion(s) of the type described above, depending on the embodiment. For example, in some embodiments, circuit description 601 does contain pre-determined assertions and these assertions remain unchanged in the transformed description 603. In other embodiments, circuit description 601 does not contain pre-determined assertions and instead these assertions are held in a separate file, and they are added to the circuit description from the separate file after addition of metastability injectors as described above in reference to act 610. Note that regardless of when added, transformed description 603 contains one or more pre-determined assertions and one or more metastability injectors.

The transformed description 603 is analyzed by a computer 605, as per act 620, using any method well known in the art. In many embodiments, act 620 involves performance of a formal verification method (such as bounded model checking in some particular embodiments). Note that although computer 605 is used in some embodiments to perform a formal verification method on description 603, act 620 may be performed in other embodiments by computer 602 (that performed act 601), or act 620 may even be performed manually in still other embodiments.

Note that when the same computer 602 performs both acts 610 and 620, in some embodiments a transformed circuit description 603 is an internal representation (e.g. in the form of a graph) of the circuit 100 and is directly transformed by the addition of metastability injectors as per act 610 and the resulting transformed internal representation is used directly during analysis in act 620.

If the analysis in act 620 (FIG. 6A) finds a stimulus sequence that will cause the assertion in the transformed circuit description 603 (FIG. 6B) to be violated, during conventional RTL simulation of the transformed description 603 (as per act 630 in FIG. 6A), then a metastability problem has been found. Model checking in act 620 may use a Boolean formula that is TRUE if and only if the underlying state transition system can realize a sequence of state transitions that reaches certain states of interest within a fixed number of transitions. If such a sequence cannot be found at a given length, k, the search is continued for larger k. If a limit "L" is reached without finding a sequence, the circuit designer may conclude that there are no errors sourced from metastability effects and therefore use the circuit description (without metastability injectors) to fabricate (as per act 641) an integrated circuit die 607, which may be tested and used in the normal manner.

In act 620 if a stimulus sequence to violate the assertion is found, the "yes" branch in act 630 (FIG. 6A) is taken, and act 650 is performed by computer 605 in some embodiments or by computer 602 in other embodiments. In act 650, the transformed circuit description 603 is simulated using the stimulus sequence determined in act 620 (FIG. 6A).

Next, in act 660, the simulation waveforms are displayed on a computer screen (e.g. screen 605 in FIG. 6B) so that a circuit designer 606 may diagnose the metastability problem. The circuit designer 606 may then revise their original circuit description as per act 670, and the revised description is optionally again subjected to acts 610–660 (e.g. act 610 is performed again by computer 602 this time on the revised circuit description, to generate another transformed description followed by analysis as per act 620 and so on).

If the model checking performed in act 620 does not find any stimulus sequence that will cause the assertion to be violated in conventional RTL simulation of the transformed circuit description 603, then act 640 is performed, and the circuit description 601 (or the revised circuit description) is deemed to not have a metastability problem (and a message to this effect is displayed on the computer screen).

Figure 6C:
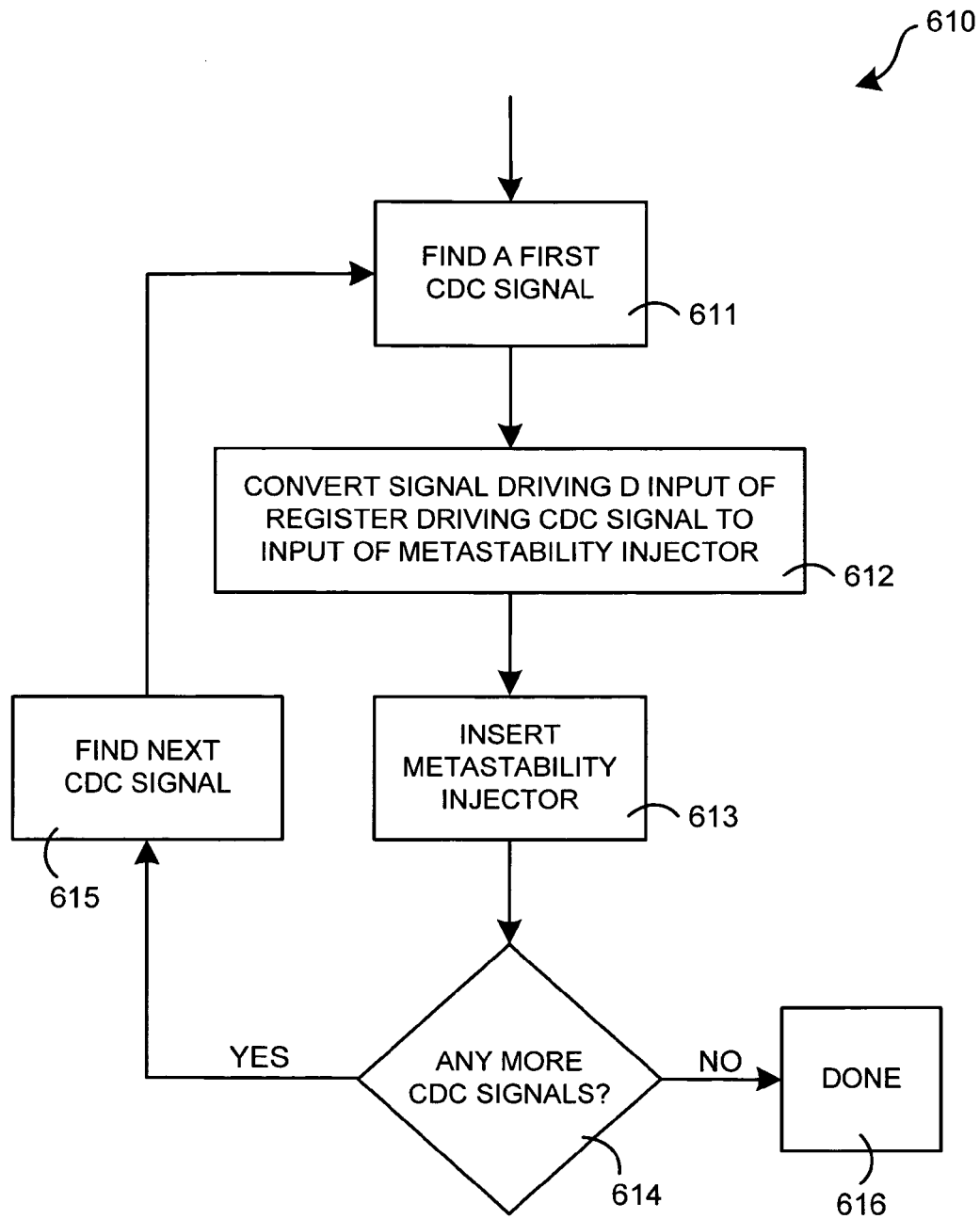
FIG. 6C illustrates, in a flowchart, one exemplary implementation of an act of transformation 610 in FIG. 6A.

FIG. 6C illustrates one embodiment of an implementation of the transformation act 610 of FIG. 6A that automatically transforms the description of the circuit under verification by adding metastability injectors. Specifically, in act 611, a path of a clock domain crossing signal is found in the circuit description 601 that is to be transformed, and this path is set as the current path.

Next in act 612, the current path is replaced by (a) an input path to a metastability injector, (b) the metastability injector itself, and (c) an output path from the metastability injector. Additional connections that may be required, depending on the internal design of the metastability injector are also made in act 612, as appropriate. For example, a path carrying the TX_D signal which is connected to the D input of register 112 (FIG. 5C) that drives the clock-domain-crossing (CDC) signal is determined and this path is connected (as per act 612 in FIG. 6C) to path 506 of metastability injector 510 (FIG. 5C).

Next, in act 613, the metastability injector 510 itself is inserted into the path of the CDC signal. Specifically, an input path 504A of the metastability injector 510 is connected to the Q output of register 112 (FIG. 5C). Finally, an output path 504B of metastability injector 510 is connected to the D input of the register of the receive clock domain 102 (see register 111 in FIG. 5C). Next, in act 614, a check is made as to whether any more CDC signals exist and if so, the path of the next CDC signal is set as the current path and control returns to act 612 (described above). If there no more CDC signals, then the transformation is completed (as per act 616 in FIG. 6C).

Figure 6D:
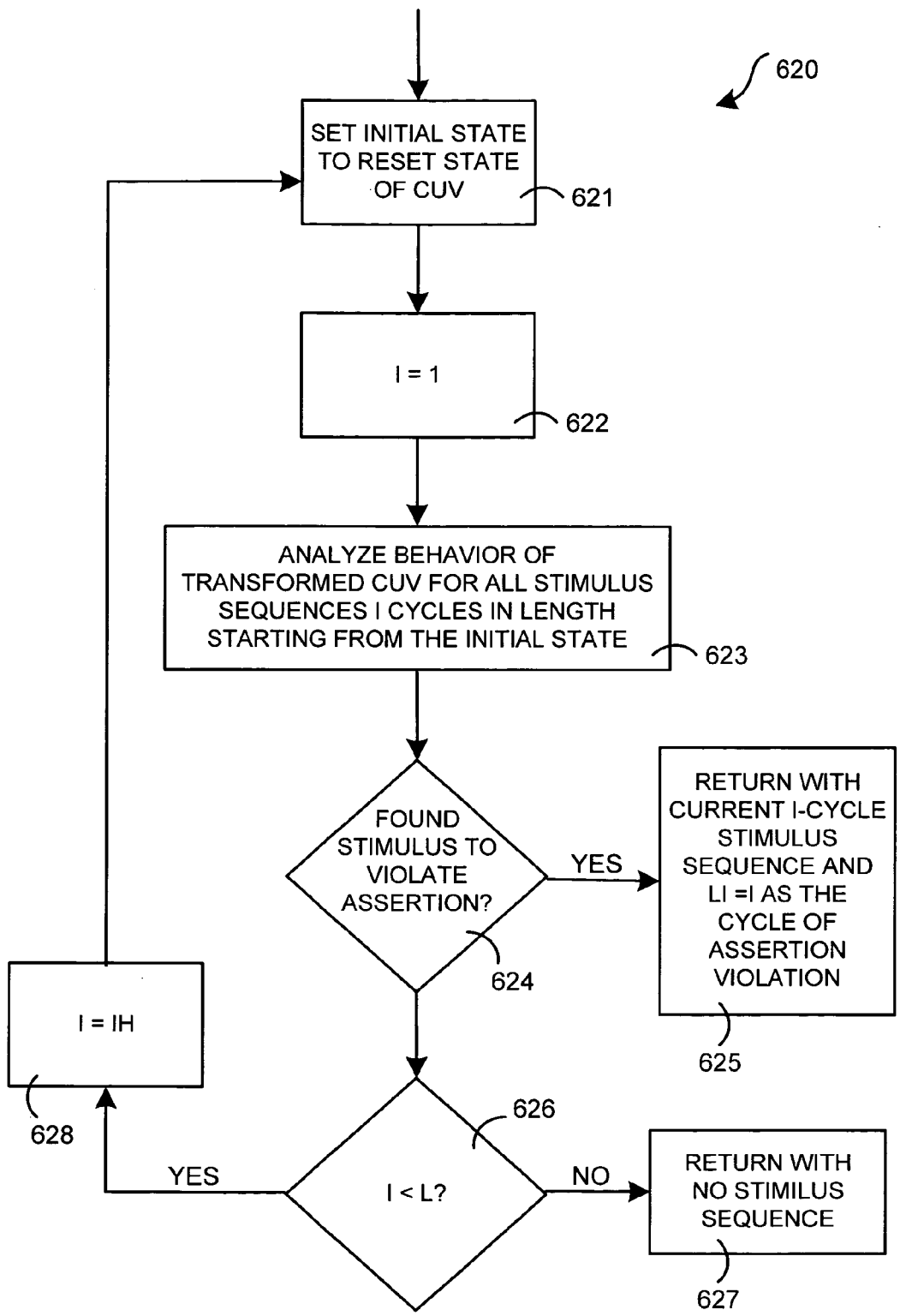
FIG. 6D illustrates, in a flowchart, one exemplary implementation of an act of analysis 620 in FIG. 6A.

FIG. 6D illustrates an implementation of the analysis act 620 of FIG. 6A in some embodiments. In these embodiments, a model checking method is used to analyze the transformed circuit description 603 resulting from act 620 (or the transformed circuit model as noted above) to find a stimulus sequence that will cause the assertion to be violated during conventional RTL simulation of the transformed circuit description. In such embodiments, an initial state for the model checking analysis may be set (as per act 621) to a reset state (which may be any one of several reset states) that the transformed circuit under verification (also called "transformed CUV") may have.

Depending on the circuit design, one of the reset states may be for all registers to be set to logic level zero, whereas other reset states may be for one or more of the registers to be set to logic value 1 while all other registers are set to logic value 0, or for some registers to be set to a state representing "don't care" (i.e., the register can be assigned either logic value 0 or logic value 1 during formal analysis). Note that an initial state for use in model checking in act 620 may be manually selected by a user to be any state. Alternatively, an initial state may be obtained from test-benches used in simulation (e.g. in a commercially available simulator such as VCS from Synopsys, Mountain View, Calif.).

Next, a cycle identifier I is set to 1 in act 622 and control is transferred to act 623. In act 623, the behavior of the transformed circuit is analyzed for all stimulus sequences I cycles in length, starting from the initial state. As noted above, in act 622 the cycle identifier was set to 1 and therefore the analysis in this first iteration is for only 1 cycle in length, although in later iterations that reach act 623 from act 628 the analysis becomes deeper (if no assertion is violated).

Then, in act 624, a check is made to see if a stimulus sequence is found that will cause the assertion to be violated, and if so the yes branch is taken and act 625 is performed. Specifically, the model checking method is concluded and the stimulus sequence is returned along with the current cycle (e.g. variable "LI" is set to I). If in act 624, the stimulus sequence is not found, then control is transferred to act 626. In act 626, a check is made as to whether a predetermined limit L on the cycle identifier I has been reached and if not then I is increased by one, and the process is iterated (returning to act 623). If the predetermined limit L was reached, then the model checking is concluded in act 627, and returns with no stimulus found.

Many alternative methods of selecting an initial state for the model checking method (as per act 621 in FIG. 6D) will be apparent to a person skilled in the art, including: selecting an initial state that is a non-reset state of the circuit under verification ("CUV"); selecting an initial state from simulation of the; selecting an initial state by analyzing waveforms from simulation of the CUV; selecting an initial state from simulation such that at least two simulated clock edges are aligned to allow metastability to occur according to the setup and hold time parameters of a register in the; and using a programmed computer to automatically determine an initial state. Similarly, it will be apparent to a person skilled in the art that an initial state for the model checking method can represent all reachable states of the CUV.

Many alternative embodiments of the model checking method 620 will be apparent to a person skilled in the art in view of this detailed description. Several such embodiments use one of the model checking methods described in "Model Checking", E. Clarke, O. Grumberg, and D. Peled, MIT Press, 1999, and in "Bounded model checking using satisfiability solving," E. Clarke, A. Biere, R. Raimi, and Y. Zhu, Formal Methods in Systems Design, 19(1):7–34, 2001 in place of the model checking method 620 shown in FIG. 6D. The just-described two papers are incorporated by reference herein in their entirety.

Figure 6E:
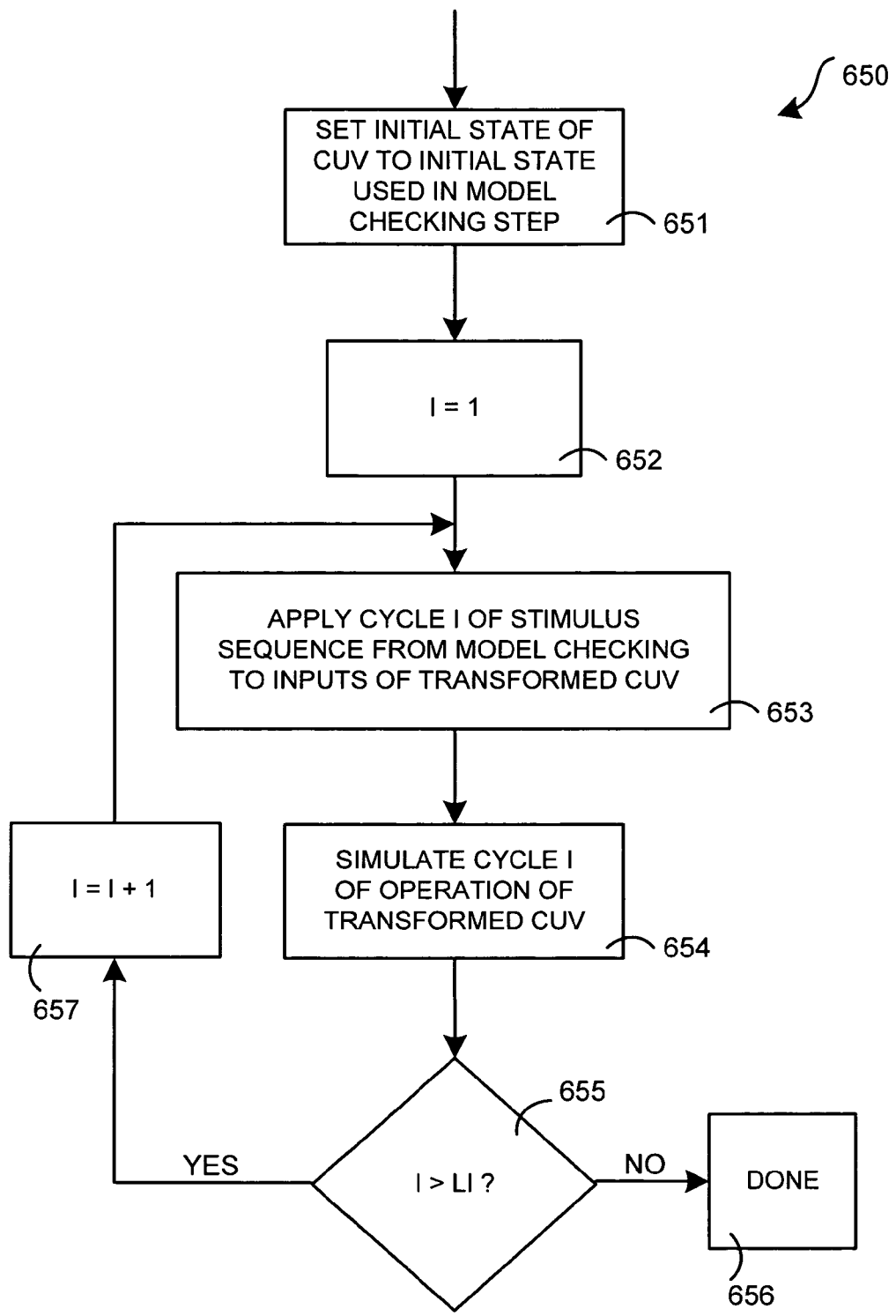
FIG. 6E illustrates, in a flowchart, one exemplary implementation of an act of simulation 650 in FIG. 6A.

FIG. 6E shows one embodiment of a simulation act 650 of FIG. 6A. Specifically, in act 651, the initial state of the transformed CUV is set to the initial state used by the model checking step, and in act 651 the value of I is set to one. Note that the same cycle count I that was used in analysis act 620 is now used for simulation in act 650. Then, in act 653, stimulus for cycle number I from the model checking step of FIG. 6A is applied to the inputs of the transformed CUV and in act 654 cycle number I of operation of the transformed CUV is simulated. If I is less than a limit set by the variable LI returned from model checking, then I is increased by one and the process is iterated, otherwise the simulate step of FIG. 5A is complete. Note that LI is the cycle in which the model checking method finds the assertion to have been violated.

Figure 4A:
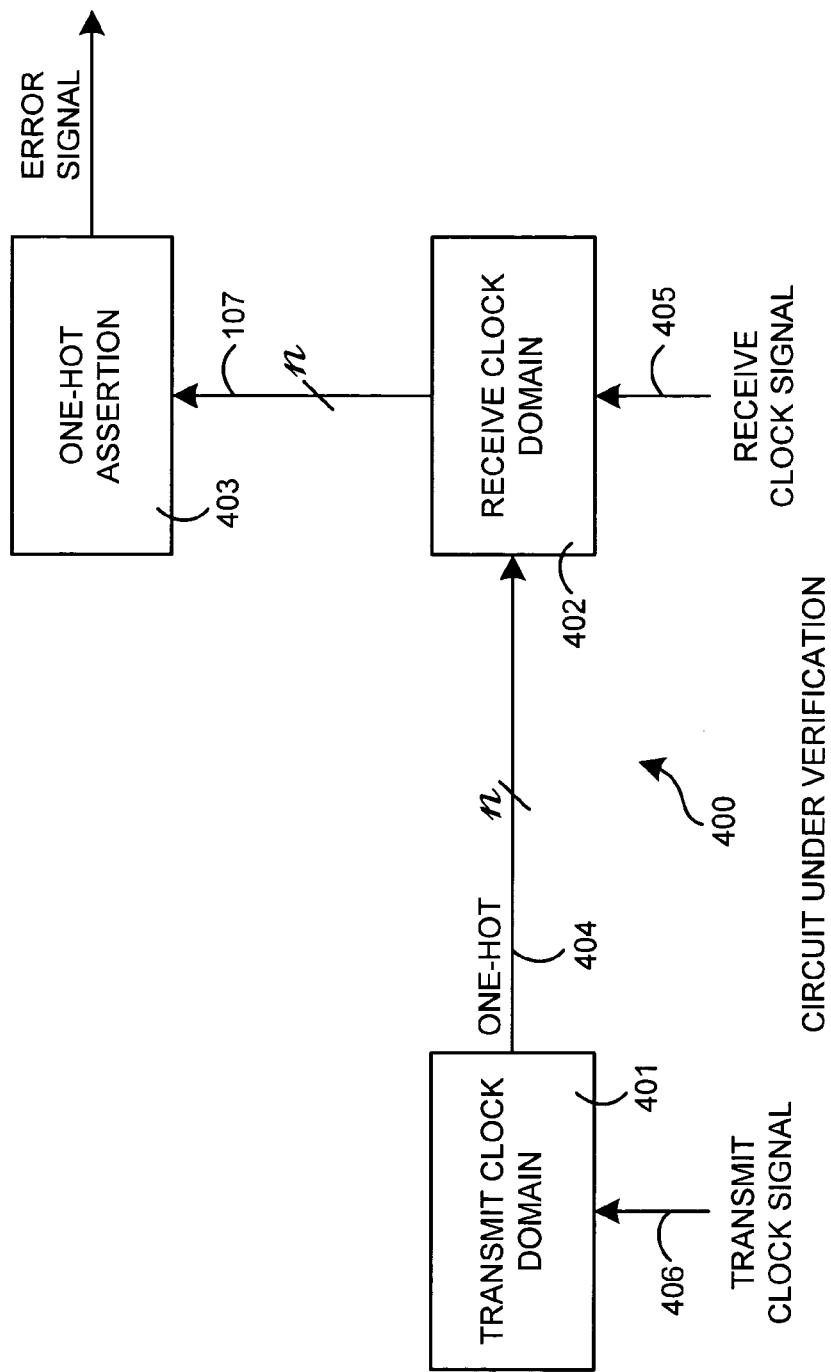
FIG. 4A shows, in a block diagram, an example circuit having N CDC signals and a one-hot assertion.

Performance of method 600 (FIG. 6A) on the example circuit of FIG. 4 is now described for some embodiments of the invention. Although in FIG. 7 the circuitry being inserted is shown by way of drawings, in several embodiments a Verilog description of the circuit under verification ("CUV") shown in Appendix A is transformed by act 610 into the corresponding Verilog description of the transformed CUV in Appendix B (which is also located just before the claims). Note that Appendix B is an integral portion of this detailed description of an embodiment of the invention, and is incorporated by reference herein in its entirety. Note also that in some embodiments, the Verilog description of Appendix A is transformed by act 610 into an internal representation equivalent to the Verilog description of Appendix B.

Figure 4B:
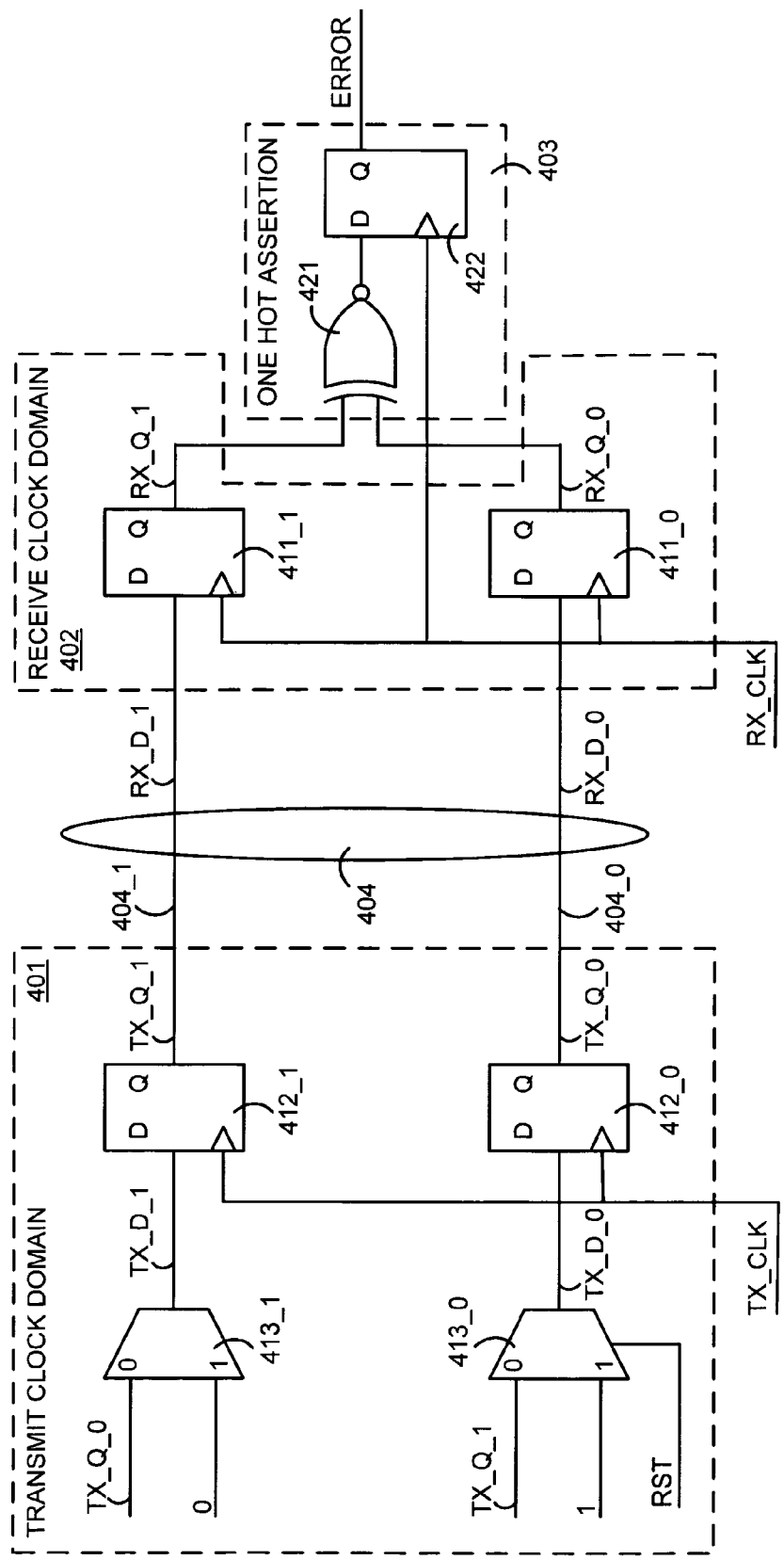
FIG. 4B shows, in a detailed circuit diagram, the circuit of FIG. 4A having two CDC signals.

In act 610, a first metastability injector 701 (FIG. 7) is inserted in the path of CDC signal RX_D_0 of FIG. 4B, and a second metastability injector 702 (FIG. 7) is inserted in the path of the CDC signal RX_D_1 of FIG. 4B. Specifically, the circuitry in FIG. 4 is changed as follows, starting with circuit description 601. A module for the metastability injector in Verilog is copied and placed into description 601 twice, once for injector 701 and again for injector 702. When adding injectors 701 and 702 into the description 601, signals are appropriately renamed and/or the signal names are used in appropriate places for the injectors to become inserted into the paths of the CDC signals.

For example, whatever the CDC signal names are (such as signal names TX_Q_0 and TX_Q_1) these same names are used as the names of the CDC signal input to the respective injectors 701 and 702 (e.g. in injector 701 name TX_Q_0 may be used at each of (a) multiplexer input, (b) inverter input, and (c) XOR gate input). Moreover, whatever signal names are present at the data input of the transmitting registers (e.g. signal names TX_D_0 and TX_D_1) these names are used as the names of the early CDC signals at the respective injectors 701 and 702 (e.g. signal name TX_D_0 is used as a second input of the XOR gate). Finally, the names of signals that are output by injectors 701 and 702 are used as the signals input to receiving registers RX_REG_0 and RX_REG_1 in receive clock domain 102 (instead of the names of the CDC signals that were originally present in circuit description 601). In Appendix B, there are two new inputs in the transformed circuit description 603 that were not previously present in Appendix A, namely jitter_control_0 and jitter_control_1 which respectively represent two enable signals for the two metastability injectors 701 and 702. Note that one additional input for alignment between the receive and transmit clocks is not used in this embodiment (whose output is shown in Appendix B), although such an additional input is used in other embodiments.

Transformations of the type described in the previous paragraph, to add metastability injectors to a circuit description 601 can be done either directly in the Verilog language, or alternatively the transformations can be done on a schematic which is then translated into Verilog language. Moreover, such transformations can be done automatically in a computer 602 or alternatively the transformations can be done manually.

Note that when there are multiple metastability injectors in a transformed CUV, the enable signal of each metastability injector may be turned on or off independent of the other metastability injectors. Furthermore, even in the case of an "n" bit bus 704 whose signals are all stored in a single "n" bit register in a single device, note that each path for each bit in bus 704 has its own metastability injector, and each metastability injector may be independently enabled (so that each bit in the "n" bit register is made metastable independent of any other bit in the "n" bit register).

In some embodiments of the invention, the Verilog description in Appendix B is analyzed as per act 620 (FIG. 6A) by a computer programmed with a model checking program called "VIS" that is available via the Internet at "www-cad" dot "eecs" dot "berkeley" dot "edu" slash "Respep" slash "Research" slash "vis", wherein the word "dot" should be replaced by "." and the word "slash" is to be replaced by "/" to form the "http" address of a web page at the University of California, Berkeley. Note that the VIS system is also described in an article entitled "VIS: A System for Verification and Synthesis", The VIS Group, In the Proceedings of the 8th International Conference on Computer Aided Verification, p428–432, Springer Lecture Notes in Computer Science, #1102, Edited by R. Alur and T. Henzinger, New Brunswick, N.J., July 1996, which is incorporated by reference herein in its entirety.

Specifically, the VIS system is used to analyze the transformed CUV in Appendix B to determine stimulus to apply to the inputs of the transformed CUV during simulation of the transformed CUV using a conventional RTL simulator such as VCS or NC Verilog in order to violate the assertion. As described above, violation of the assertion during RTL simulation of the transformed CUV indicates that metastability in the physical CUV may cause incorrect behavior of the physical CUV.

In order to use the model checking method of the VIS system to determine the stimulus sequence to apply to the inputs of the transformed CUV in order to violate the assertion as per act 620 in FIG. 6A, the Verilog representation of the transformed CUV shown in Appendix B is placed in a file named "translate.v" and provided as input to a sequence of VIS system commands shown below:

vl2mv -c -F translate.v
read_blif_mv translate.mv
flatten_hierarchy
static_order
build_partition_mdds
check_invariant -f -d 1 -i -v 2 invar The sequence of VIS system commands "vl2mv", "read_blif_mv", "flatten_hierarchy", "static_order" and "build_partition_mdds" shown above create an internal representation of the transformed CUV in preparation for model checking. The VIS system command "check_invariant" shown above performs model checking on the internal representation of the transformed CUV. The file "invar" in the VIS system command "check_invariant -f -d 1-i -v 2 invar" in the above set of commands contains a line "error=0", directing the model checking program of the VIS system to find a counterexample for the invariant "error=0", i.e., to find a counterexample for the one-hot checker in the transformed CUV.

In response to the sequence of commands shown in the previous paragraph, the model checking program of the VIS system produces an output file shown in Appendix C (which is located below, just before the claims). Appendix C forms an integral portion of this detailed description of some embodiments of the invention, and is incorporated by reference herein in its entirety. The output file shown in Appendix C represents the stimulus sequence to apply to the inputs of the transformed CUV during simulation using a conventional RTL simulator such as VCS or NC Verilog, starting from the reset state of the CUV, to violate the invariant "error=0", i.e., to violate the one-hot assertion in the transformed CUV.

Thereafter, as per act 650, the VCS simulator is used to simulate the transformed CUV along with the stimulus sequence shown in Appendix C as input, starting from the reset state of the CUV. In addition, as per act 660, waveforms from the simulation are displayed on a computer screen (shown in FIG. 8), using a waveform viewer such as SimVision from Cadence Design Systems, Inc.

Figure 8:
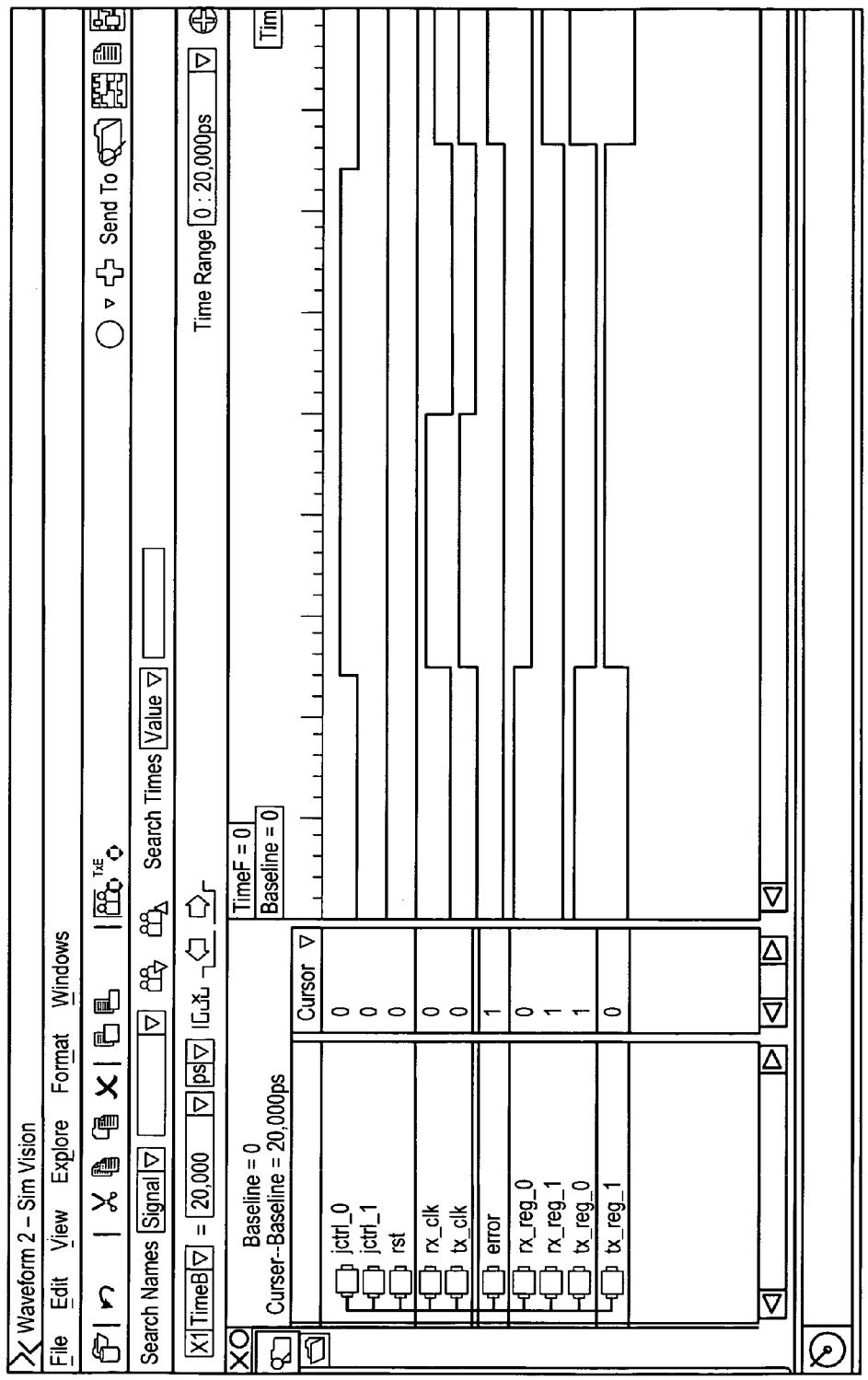
FIG. 8 illustrates a display on a computer screen of waveforms from simulation of a description (in Verilog) of the circuit of FIG. 7 while applying a stimulus sequence in accordance with the invention.

In the simulation waveforms shown in FIG. 8, at time 4800 ps, jitter control input jitter_control_0 of the transformed CUV becomes asserted, modeling the case in which the physical register rx_reg_0 enters the metastable state at the rising edge of rx_clk at time 5000 ps and then settles to the inverse of the logic value that would be produced by conventional RTL simulation of the non-transformed circuit, thus violating the one-hot assertion and causing the error signal to become asserted at time 15000 ps. As described above, violation of the one-hot assertion indicates that metastability in the physical CUV may cause incorrect behavior of the physical CUV.

Figure 7:
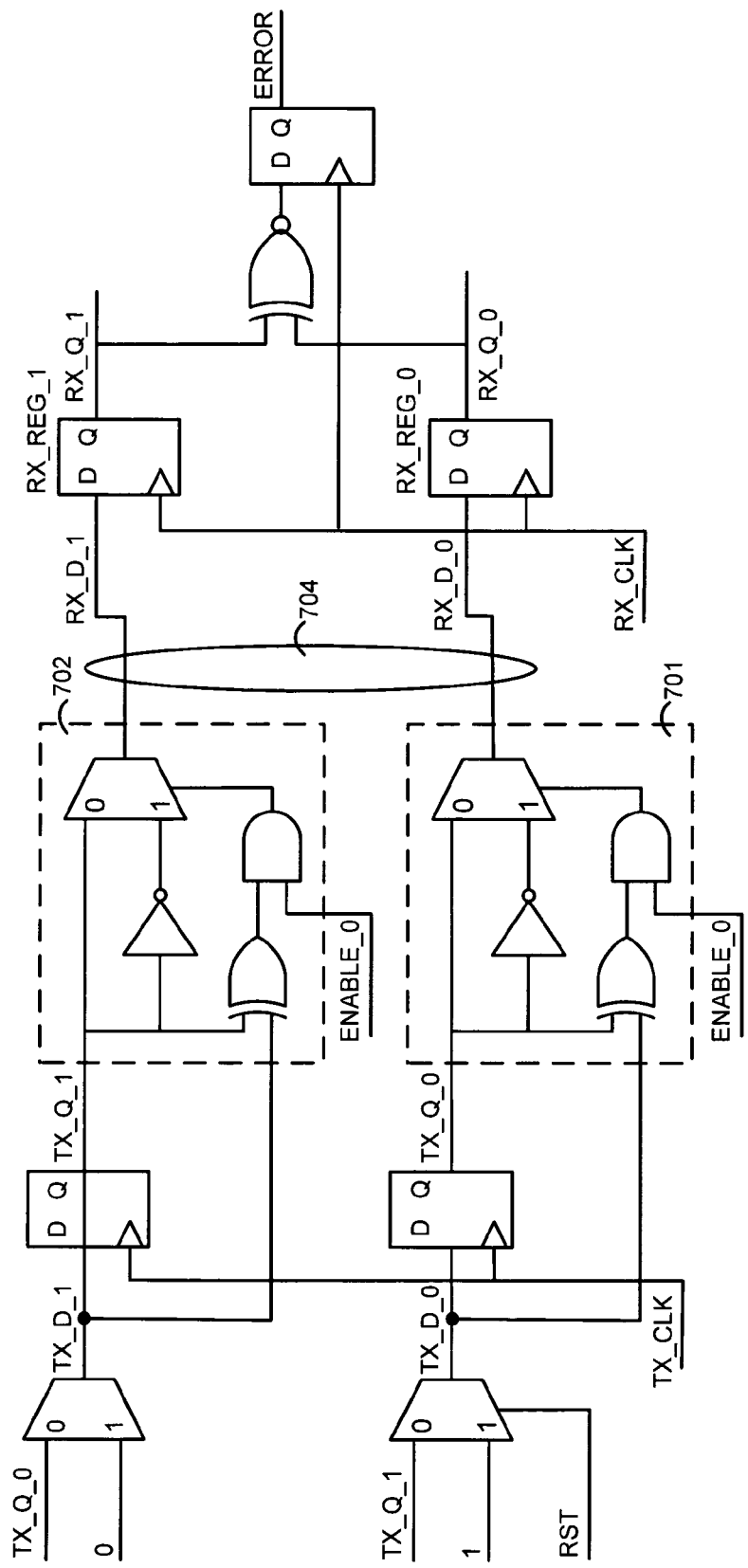
FIG. 7 illustrates a transformed circuit obtained by performing the method of FIG. 6C on the circuit of FIG. 4B.

Although, for illustrative purposes, the example circuit shown in FIG. 7 is small, containing only two clock signals and five registers, the method described above for the example circuit is also applied in the same manner to large circuits, for example, circuits containing hundreds of millions of registers and hundreds of thousands of clock signals. Numerous modifications and adaptations of the embodiments described herein will be apparent to a person of skill in the art of electronic design automation (EDA) in view of this disclosure.

Other embodiments of a method in accordance with the invention include one or more of the following steps: (1) automatically transforming a description of a CUV containing a predetermined assertion that is automatically inferred; (2) automatically transforming a description of a CUV containing a pre-determined assertion that is user-specified; (3) automatically transforming a description of a CUV containing a pre-determined assertion to detect incorrect behavior of the CUV due to metastability of a clock-domain-crossing (CDC) signal; (4) selecting an initial state for use by the model checking method that represents all reachable states of the CUV; (5) using a Verilog representation of the CUV as input to the model checking step; (6) using a VHDL representation of the CUV as input to the model checking step; (7) using a representation of the CUV stored in computer memory as input to the model checking step; (8) using a representation of the CUV stored on disk as input to the model checking step.

Although the present invention is illustrated in connection with specific embodiments for instructional purposes, the present invention is not limited thereto. Various adaptations and modifications may be made without departing from the scope of the invention. For example, although model checking is used in some embodiments, other embodiments use other formal verification methods to find a stimulus sequence that violates an assertion as noted above.

Tools for formal verification that may be used in act 620 are available in the prior art (either commercially or from public sources such as universities and laboratories), and may be based on any of a number of techniques, such as (1) symbolic model checking, (2) symbolic simulation, (3) explicit state enumeration, and (4) satisfiability (SAT). For background on each of the just-described techniques, see, for example, the following references, each of which is incorporated by reference herein in its entirety:

(1) an article by J. R. Burch, E. M. Clarke, K. L. McMillan, D. L. Dill, and J. Hwang, entitled "Symbolic model checking: 1020 states and beyond", published in Information and Computation, Vol. 98, no. 2, June 1992; another article entitled "Coverage Estimation for Symbolic Model Checking" by Yatin Hoskote, Timothy Kam, Pei-Hsin Ho, and Xudong Zhao, published in Proceedings of DAC 1999 (Best Paper Award), pp. 300–305, and a PhD thesis by K. L. McMillan entitled "Symbolic model checking—an approach to the state explosion problem", Carnegie Mellon University, 1992;

(2) article entitled "Automatic Verification of Pipelined Microprocessor Control," by Jerry R. Burch and David L. Dill, published in the proceedings of International Conference on Computer-Aided Verification, LNCS 818, Springer-Verlag, June 1994;

(3) article by E. M. Clarke, E. A. Emerson and A. P. Sistla entitled "Automatic verification of finite-state concurrent systems using temporal logic specifications" published in ACM Transactions on Programming Languages and Systems, 8(2):244–263, 1986; and article entitled "Protocol Verification as a Hardware Design Aid" by David Dill, Andreas Drexler, Alan Hu and C. Han Yang published in Proceedings of the International Conference on Computer Design, October 1992.

(4) article entitled "Bounded Model Checking Using Satisfiability Solving" by Edmund Clarke, Armin Biere, Richard Raimi, and Yunshan Zhu, published in Formal Methods in System Design, volume 19 issue 1, July 2001, by Kluwer Academic Publishers.

In addition, see U.S. Pat. No. 5,465,216 granted to Rotem, et al. on Nov. 7, 1995, and entitled "Automatic Design Verification" (that is incorporated by reference herein in its entirety) for an additional example of formal verification tool. See also U.S. Pat. No. 6,192,505 granted to Beer, et al. on Feb. 20, 2001, and entitled "Method and system for reducing state space variables prior to symbolic model checking" that is incorporated by reference herein in its entirety.

Formal verification tools available in the prior art for property checking include, for example, Symbolic Model Verification (SMV) software package available from Carnegie-Mellon University, and the coordinated specification analysis (COSPAN) software package available from Bell Laboratories (e.g. at ftp "dot" research "dot" att "dot" com wherein the word "dot" is to be replaced by "." to form the ftp address).

For additional information on formal verification tools, see C. Kern and M. R. Greenstreet, "Formal Verification in Hardware Design: A Survey," in ACM Trans. on Design Automation of Electronic Systems, vol. 4, pp. 123–193, April 1999, that is incorporated by reference herein in its entirety.

Note also that some embodiments of the invention may be implemented as described in an article entitled "Formally Verifying Clock Domain Crossing Jitter Using Assertion-Based Verification", Design And Verification Conference, Tai Ly, Neil Hand and Chris Ka-kei Kwok, February 2004 that is incorporated by reference herein in its entirety.

Also, although formal verification is used in some embodiments of act 620, other embodiments may use other methods. For example, one alternative embodiment performs act 620 by simulation (either manually or using a simulator) of each and every possible stimulus (wherein the stimulus sequence is a sequence of vectors, with one vector of inputs for each cycle), for the number of cycles "L" and check if the assertion is violated during the simulation. So, in the example illustrated in FIG. 7, there are four possible inputs for the first cycle (as there are two enable signals for the two metastability injectors and each enable signal can be either asserted or deasserted). There are also four possible inputs for the second cycle. Therefore, if L is 2 in this example, then there are 16 possible sequences of inputs all of which are simulated.

Moreover, according to the method of the invention, an initial state represented in the Verilog can correspond to any state reachable by the circuit under verification during normal operation.

Furthermore, although transmission of a one-hot signal across clock domains, and checking by the pre-determined assertion that the signal in the receive clock domain is in fact one hot has been described above in some embodiments, other embodiments may transmit signals with other properties across clock domains, and check their respective properties conform to the circuit designer's expectations. For example, some embodiments transmit a Gray coded signal for a count across clock domains, and the pre-determined assertion checks to confirm that the signal received in the receive clock domain is in fact Gray coded (e.g. that no more than one bit changes in each successive cycle).

Note that software (including instructions and data structures) for performing acts of the type illustrated in FIGS. 6A–6E may be embedded in computer readable storage media such as disk drives, magnetic tape, CDs (compact discs) and DVDs (digital versatile discs or digital video discs), and/or encoded in transmission media (with or without a carrier wave upon which the signals are modulated) including a communications network, such as the Internet.

Therefore, the spirit and scope of the appended claims should not be limited to the foregoing description.

APPENDIX A (PRIOR ART)

```
1
2  module design (tx_clk, rx_clk, rst, rx_q_0, rx_q_1, error);
3  input tx_clk, rx_clk, rst;
4  output rx_q_0, rx_q_1, error;
5
6  wire tx_d_0, tx_d_1, tx_q_0, tx_q_1, rx_d_0, rx_d_1;
7  reg tx_reg_0, tx_reg_1, rx_reg_0, rx_reg_1;
8  reg error;
9
10 assign tx_q_1 = tx_reg_1;
11 assign tx_q_0 = tx_reg_0;
12 assign tx_d_1 = tx_q_0;
13 assign tx_d_0 = tx_q_1;
14
15 initial begin
16    error = 1'b0;
17    tx_reg_1 = 1'b0;
18    tx_reg_0 = 1'b1;
19    rx_reg_1 = 1'b0;
20    rx_reg_0 = 1'b1;
21 end
22
23 always @(posedge tx_clk) begin
24    if (rst) begin
25       tx_reg_1 = 1'b0;
26       tx_reg_0 = 1'b1;
27    end
28    else begin
29       tx_reg_1 = tx_d_1;
30       tx_reg_0 = tx_d_0;
31    end
32 end
33
34 assign rx_q_1 = rx_reg_1;
35 assign rx_q_0 = rx_reg_0;
36
37 always @(posedge rx_clk) begin
38    rx_reg_1 = rx_d_1;
39    rx_reg_0 = rx_d_0;
40 end
41
42 always @(posedge rx_clk) begin
43    if (rx_q_0 == rx_q_1) error = 1'b1;
44 end
45
46 endmodule
```

APPENDIX B (example in one embodiment of invention)

```
1  module design (tx_clk, rx_clk, rst, rx_q_0, rx_q_1, error,
2          jitter_control_0, jitter_control_1);
3  input tx_clk, rx_clk, rst;
4  output rx_q_0, rx_q_1, error;
5  input jitter_control_0, jitter_control_1;
6  wire tx_d_0, tx_d_1, tx_q_0, tx_q_1, rx_d_0, rx_d_1;
7  reg tx_reg_0, tx_reg_1, rx_reg_0, rx_reg_1;
8  reg error;
9
10 assign tx_q_1 = tx_reg_1;
11 assign tx_q_0 = tx_reg_0;
12 assign tx_d_1 = tx_q_0;
13 assign tx_d_0 = tx_q_1;
14
15 initial begin
16    error = 1'b0;
17    tx_reg_1 = 1'b0;
18    tx_reg_0 = 1'b1;
19    rx_reg_1 = 1'b0;
20    rx_reg_0 = 1'b1;
21 end
22
23 always @(posedge tx_clk) begin
24    if (rst) begin
25       tx_reg_1 = 1'b0;
26       tx_reg_0 = 1'b1;
27    end
28    else begin
29       tx_reg_1 = tx_d_1;
30       tx_reg_0 = tx_d_0;
31    end
32 end
33
34 assign rx_q_1 = rx_reg_1;
35 assign rx_q_0 = rx_reg_0;
36 assign rx_d_1 =
37    (jitter_control_1 && (tx_reg_1 !== tx_d_1)) ?
       !tx_q_1:tx_q_1;
38 assign rx_d_0 =
39    (jitter_control_0 && (tx_reg_0 !== tx_d_0)) ? !tx_q_0:
       tx_q_0;
40
41 always @(posedge rx_clk) begin
42    rx_reg_1 = rx_d_1;
43    rx_reg_0 = rx_d_0;
44 end
45
46 always @(posedge rx_clk) begin
47    if (rx_q_0 == rx_q_1) error = 1'b1;
48 end
49
50 endmodule
```

APPENDIX C (example in one embodiment of invention)

```
1
2  # INV: formula 1 failed - - - error=0
3  # INV: calling debugger
4  # INV: a sequence of states starting at an initial state leading to a
   bad state
5
6  --State 0:
7  error:0
8  rx_reg_0:1
9  rx_reg_1:0
10 tx_reg_0:1
11 tx_reg_1:0
12
13 --Goes to state 1:
14 error:0
15 rx_reg_0:0
16 rx_reg_1:0
```

APPENDIX C-continued (example in one embodiment of invention)

```
17 tx_reg_0:0
18 tx_reg_1:1
19 --On input:
20 jitter_control_0:1
21 jitter_control_1:0
22 rst:0
23 tx_clk:1
24 rx_clk:1
25
26 - - -Goes to state 2:
27 error:0
28 rx_reg_0:0
29 rx_reg_1:0
30 tx_reg_0:0
31 tx_reg_1:1
32 --On input:
33 jitter_control_0:1
34 jitter_control_1:0
35 rst:0
36 tx_clk:0
37 rx_clk:0
38
39 --Goes to state 3:
40 error:1
41 rx_reg_0:0
42 rx_reg_1:1
43 tx_reg_0:1
44 tx_reg_1:0
45 --On input:
46 jitter_control_0:0
47 jitter_control_1:0
48 rst:0
49 tx_clk:1
50 rx_clk:1
51
52 # INV: Summary of invariant pass/fail
53 # INV: formula failed --- error=0
```

What is claimed is:

1. A method of verifying a design of a circuit under verification, the method comprising:

transforming an original description of the circuit under verification by adding description of circuitry to inject effects of metastability into the circuit under verification, resulting in a transformed description; and analyzing the transformed description to determine a stimulus sequence for the transformed description to violate a pre-determined assertion, outputting the stimulus sequence, for application during a simulation to a plurality of inputs described in the transformed description, wherein said circuit under verification comprises a group of signals crossing between two clock domains and said plurality of inputs comprises a corresponding group of inputs of said circuitry added during said transforming, to inject effects of metastability, and on being asserted each input in said group of inputs enables said circuitry for a corresponding signal in said group of signals.

2. The method of claim 1, wherein said circuit under verification comprises a plurality of signals crossing between two clock domains, and wherein said transforming describes said circuitry being added as injecting effects of metastability into the output of at least one storage element receiving as input a signal in said plurality of signals.

3. The method of claim 2, wherein said transforming describes said circuitry being added as being further coupled to an input of a storage element in the transitive sequential fanin of at least one signal in said plurality of signals.

4. The method of claim 1, wherein said circuit under verification comprises a plurality of signals crossing between two clock domains, and wherein said transforming describes said circuitry being added as injecting effects of metastability into an input of at least one storage element that is described in the original description as receiving a signal in said plurality of signals as input.

5. The method of claim 4, wherein said transforming describes said circuitry being added as being further coupled to an input of a storage element in the transitive sequential fanin of at least one signal in said plurality of signals.

6. The method of claim 1, wherein the pre-determined assertion is described in the transformed description as monitoring behavior of a portion of said circuit under verification in the transitive sequential fanout of at least one signal in said plurality of signals.

7. The method of claim 1, further comprising: performing simulation of the transformed description in response to the stimulus sequence.

8. The method of claim 7, further comprising:
automatically displaying a plurality of waveforms resulting from said simulation.

9. The method of claim 1, wherein said analyzing comprises formal analysis.

10. The method of claim 9, wherein said formal analysis comprises bounded model checking.

11. The method of claim 1, wherein the pre-determined assertion is already existing in the original description prior to said transforming.

12. The method of claim 1, wherein the pre-determined assertion does not exist in the original description prior to said transforming, and the method further comprises adding the pre-determined assertion to the transformed description after said transforming.

13. The method of claim 1, wherein:
said transforming is performed automatically in a computer; and said analyzing is also performed automatically in said computer.

14. A method of verifying a design of a circuit under verification, the method comprising:

transforming an original description of the circuit under verification by adding description of circuitry to inject effects of metastability into the circuit under verification, resulting in a transformed description; analyzing the transformed description using a model checking method, to automatically determine one or more stimulus sequences that violate a pre-determined assertion, wherein said analyzing comprises using as an initial state, a state derived from simulation of the circuit under verification; and outputting the one or more stimulus sequences that violate the pre-determined assertion for display or simulation of the circuit under verification.

15. The method of claim 14, wherein said analyzing determines stimulus sequence to be applied during simulation, to a plurality of inputs described in the transformed description.

16. The method of claim 15, further comprising: performing simulation of the transformed description, in response to the stimulus sequence.

17. The method of claim 16, further comprising: displaying a plurality of waveforms resulting from said simulation.

18. The method of claim 15, wherein: at least one input in the plurality of inputs is an input of the circuitry to inject effects of metastability.

19. The method of claim 14 wherein said analyzing comprises using as an initial state, a reset state of the circuit under verification.

20. The method of claim 14 wherein said analyzing comprises using as an initial state, a non-reset state of the circuit under verification.

21. An apparatus configured to model a circuit under verification from a description thereof, wherein the apparatus comprises:
- circuitry to inject effects of metastability into a receive clock domain, the circuitry comprising a transition detector coupled to a transmit clock domain, to receive a first signal output by the transmit clock domain, the circuitry further comprising a conditional inverter coupled to the receive clock domain, to supply a second signal being input to the receive clock domain, wherein the conditional inverter supplies one of (an unaltered version and an inverted version) of the first signal as the second signal, depending on an output of the transition detector;
- a pre-determined asserter coupled to the receive clock domain to receive therefrom information related to the second signal; and
- instructions configured to perform model checking of said model, to automatically determine stimulus sequence to violate the predetermined assertion.

22. The apparatus of claim 21 wherein said circuitry is configured to:
- supply one of the unaltered version and the inverted version when the enable signal is asserted; and
- unconditionally supply only the unaltered version when the enable signal is deasserted.

23. The apparatus of claim 21 wherein said transition detector is configured to:
- enable a conditional inverter on detecting transitions, when the enable signal is asserted; and
- disable the conditional inverter when the enable signal is deasserted.

24. The apparatus of claim 21 further comprising:
- instructions configured to perform simulation of said model, in response to the stimulus sequence; and
- instructions configured to display a plurality of waveforms resulting from said simulation.

* * * * *

UNITED STATES PATENT AND TRADEMARK OFFICE
CERTIFICATE OF CORRECTION

PATENT NO.       : 7,243,322 B1
APPLICATION NO.  : 10/859055
DATED            : July 10, 2007
INVENTOR(S)      : Ly et al.

It is certified that error appears in the above-identified patent and that said Letters Patent is hereby corrected as shown below:

Title Page (76) Inventors: last name of Fourth named inventor spelled wrong delete "Ross Andrew Ander" and add --Ross Andrew Andersen--

Signed and Sealed this

Eleventh Day of December, 2007

JON W. DUDAS
*Director of the United States Patent and Trademark Office*